United States Patent
Herring et al.

[11] 3,967,095
[45] June 29, 1976

[54] MULTI-COUNTER REGISTER

[75] Inventors: William M. Herring, Campton Township; Dennis B. Walling, Darien, both of Ill.

[73] Assignee: Standard Oil Company, Chicago, Ill.

[22] Filed: Aug. 26, 1974

[21] Appl. No.: 500,321

[52] U.S. Cl. .................. 235/92 EA; 235/92 ST; 235/92 DP; 235/92 R; 328/104
[51] Int. Cl.² ........................................ H03K 21/12
[58] Field of Search ....... 235/92 EA, 92 DP, 92 ST, 235/92 SH, 92 ME; 340/147 C, 147 LP, 147 MD, 172.5; 328/104

[56] References Cited
UNITED STATES PATENTS

| | | | |
|---|---|---|---|
| 3,034,101 | 5/1962 | Loewe | 235/92 EA |
| 3,597,641 | 8/1971 | Ayres | 235/92 EA |
| 3,636,319 | 1/1972 | Nixon | 235/92 EA |

*Primary Examiner*—Joseph M. Thesz
*Attorney, Agent, or Firm*—Claron N. White; Arthur G. Gilkes; William T. McClain

[57] ABSTRACT

At the general area of a set of BCD counter means, each to contain individual accumulated counts, a system, called a multi-counter register, is generally located for its use that permits the individual reading of the counter means in a selective mode by local readout means at the general area or by a computer at a remote area by the use of a small number of address channels extending from the location of the counter means to the computer. The multi-counter register includes data storage means, having inputs to receive digital information and having outputs to transmit that digital information, sets of gate means that are connected in parallel at their outputs to these inputs of the storage means and that have their inputs connectable to different BCD counter means, means responsive to signals, including signals providing digital information, to enable selectively one of said sets of gate means so that the BCD counter means connected to that enabled set of gate means is operatively connected to said inputs of said data storage means for transfer of digital information from that BCD counter means to said storage means when it can be loaded, said signal-responsive means being operatively connected to said sets of gate means, and means to provide at least one signal to another input of said storage means so that it can be loaded at said inputs, connected to said sets of gate means, with the digital information in that BCD counter means connected to that set of gate means enabled by said signal-responsive means, said signal-providing means being operatively connected to said another input of said storage means. In one construction of the invention, in which there is selection and readout by a computer, the information entered into the storage means of the multi-counter register from one of the counter means is transmittted serially to the computer. Illustratively in that construction the storage means is shift register means. In another construction of the invention the information is transmitted in a parallel manner from the storage means of the multi-counter register to the computer. Illustratively in that construction the storage means includes data latch means. The system, when having computer selection and readout, can include local readout means. In that case, there are means for manual interrogation of any desired counter means and means to prevent the operation of the manual interrogation during the operation by the computer of the multi-counter register through the operations of enabling selected sets of gate means by the signal-responsive means, enabling the storage means to be loaded with information in the counter means, and transmitting the digital information to the computer.

30 Claims, 6 Drawing Figures

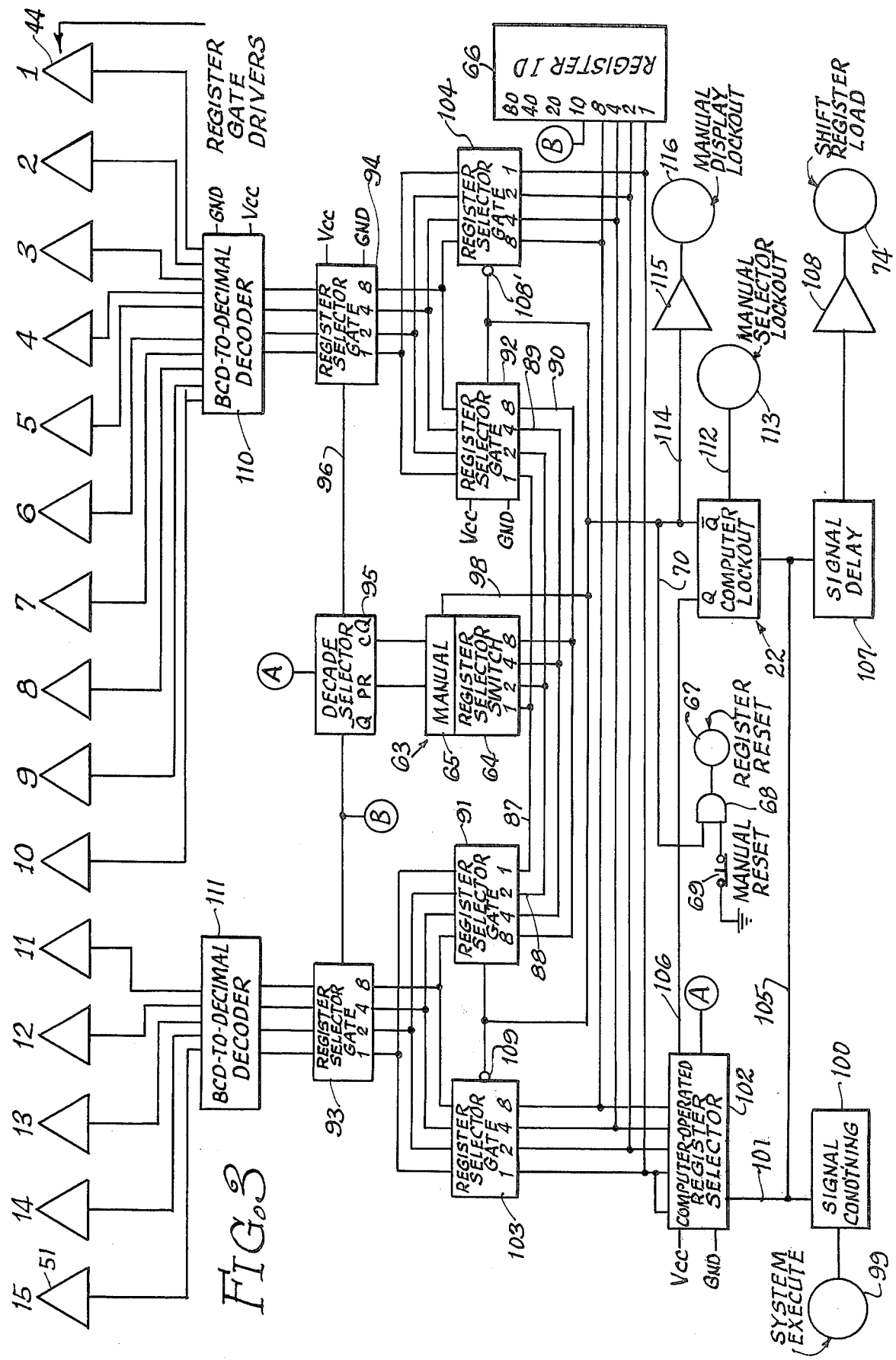

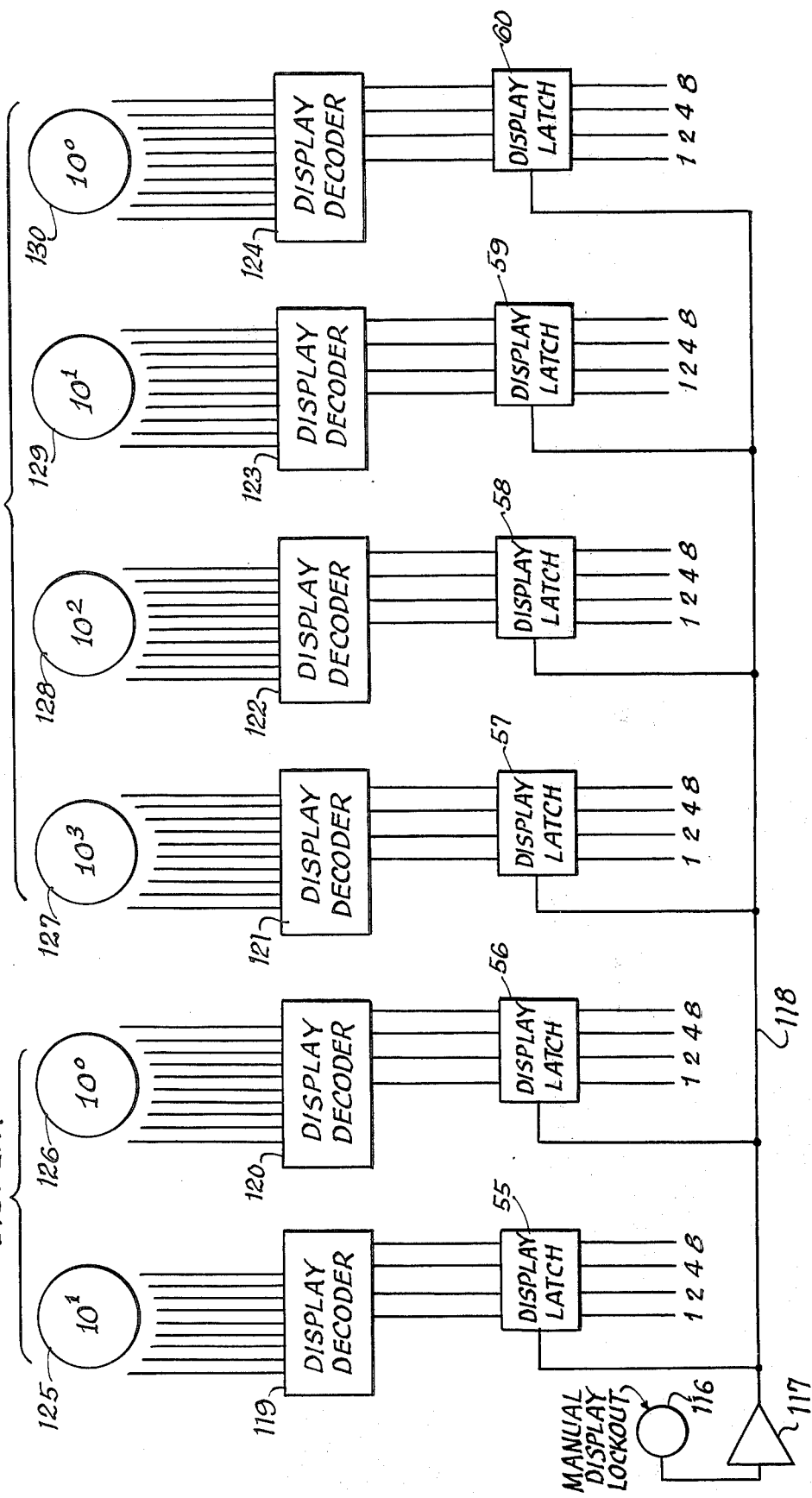

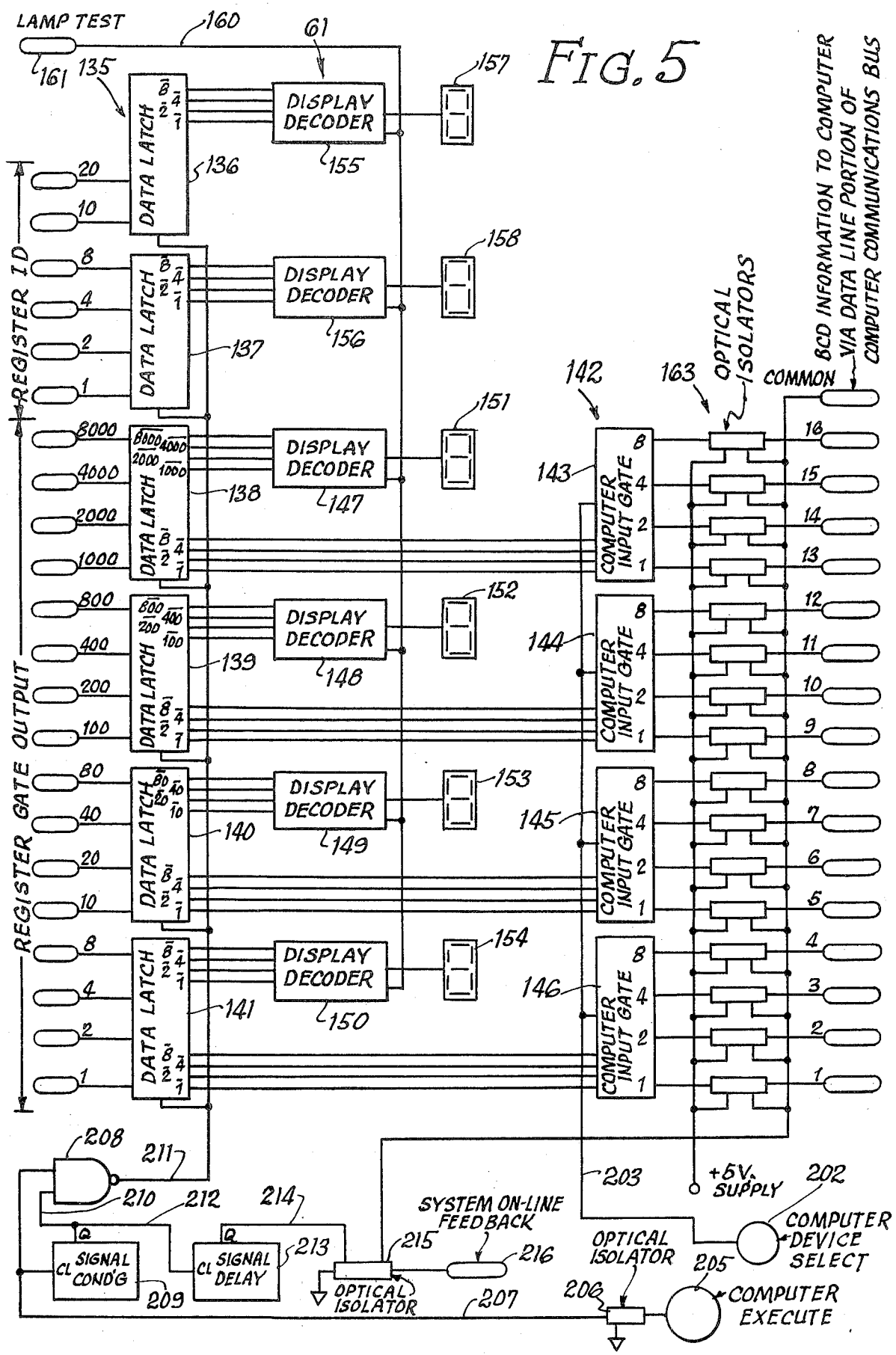

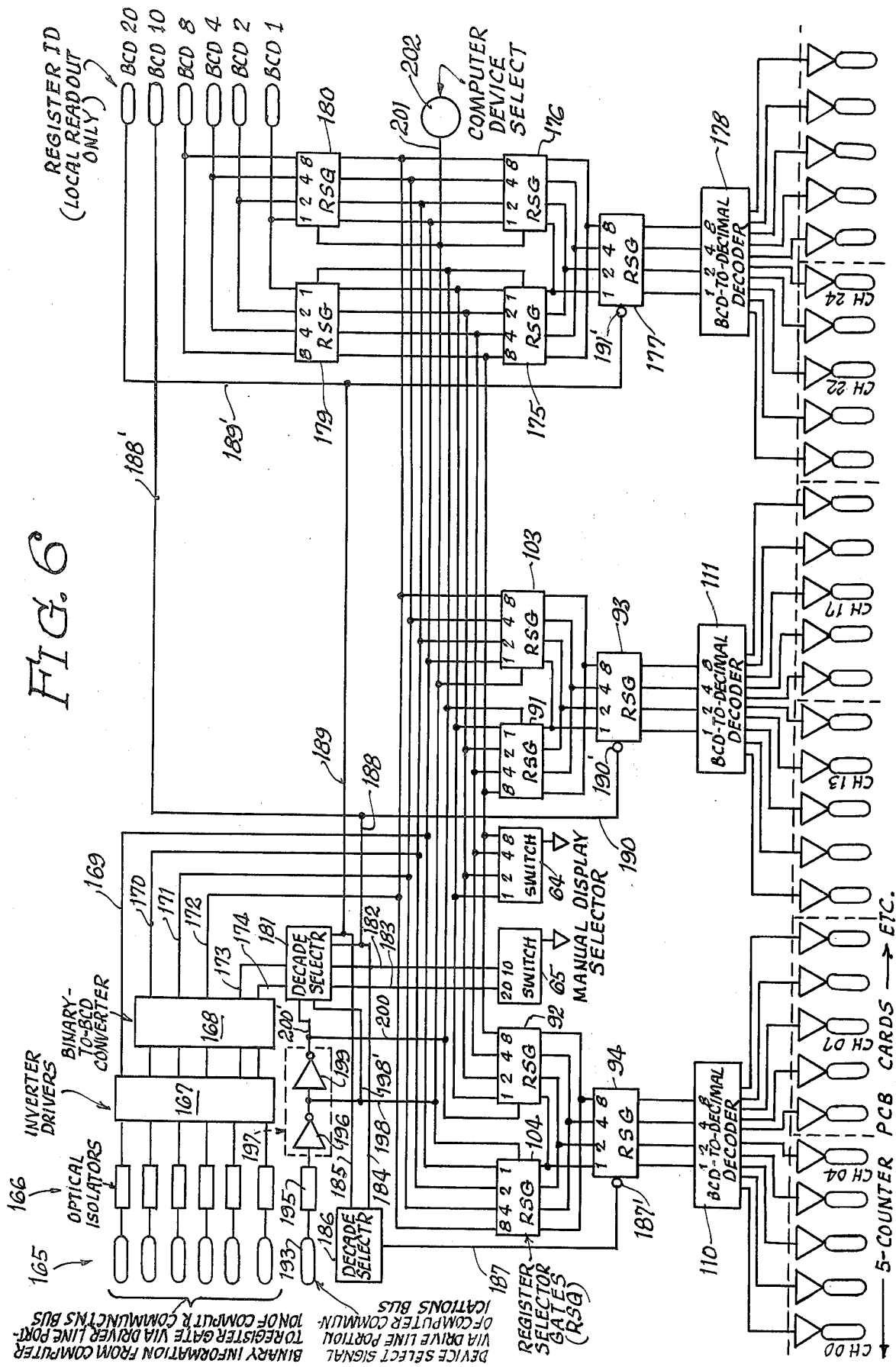

MULTI-COUNTER REGISTER

BACKGROUND OF THE INVENTION

1. Field of the Invention

In connection with the monitoring of changes of various conditions and the occurrence of specific events at a particular area at which equipment or apparatus operates it is common to use commercial pulse counters, such as the Durant counter, to accumulate pulses from flow integrators, magnetic pickups (used to count revolutions of rotating devices), pulse-generating timers, event sequencers, etc. The field of the invention is the system of transferring information from pulse counters to a computer that is located at another area, usually a substantial distance from the area in which the counters are located.

2. Description of the Prior Art

It has been the practice to use one counter register device for each pulse source located at a particular area. Each of these counter register devices is generally a multidecade counter. When interfaced to a computer, each counter register device requires n computer address channels (n = number of decades) for communication of BCD information from the counter register device to the computer. Because one area will have many individual counter register devices, the number of address channels between that area and the computer will be very substantial. For example, when there are ten four-decade counter register devices at the area, forty address channels are required. This requires substantial interface wiring. When additional counter register devices are added to the area for counting pulses representing other information it is necessary to further increase the computer interface wiring between the computer and the area at which the counter devices are located. This results in the substantial cost of installing wires between the area of the counter devices and the computer that will be in another area. That other area may be located a substantial distance from the counter devices.

SUMMARY OF THE INVENTION

This invention relates to a multi-counter register, that is a system useful at a local area, i.e., the area of installation of a number of individual BCD counter means. The first part of the summary of the invention is presented on the basis of its use for a selection and readout by a computer at a remote area, with or without local selection and readout. Then follows a description of various aspects of the system to provide local selection and readout. The system is useful for local selection and readout only of BCD counter means.

In response to signals from a computer at another location the system operates to selectively and individually receive and store information in data storage means of the system from the number of BCD counter means and in response to other signals from the computer to transmit the stored information to the computer, each time before the data storage means receives and stores digital information from any of the other BCD counter means.

Each of the BCD counter means accumulates a count of electrical pulses. These electrical pulses for the particular BCD counter means are generated from one of the several souces at that area. As mentioned earlier the pulses are generated by various devices to record changes of conditions or numbers of occurrences of events.

The system of the invention includes register means, i.e., data storage means, sets of gate means connectable as a set to different BCD counter means, means responsive to signals from the computer to enable selectively one of the sets of gate means, and means responsive to at least one signal from the computer to transfer information from the storage means to the computer. The storage means has inputs connected to outputs of the sets of gate means. The connection between these inputs of the storage means and the outputs of each set of the sets of gate means is in parallel to the connection between those inputs of the storage means and the outputs of the other sets of gate means. Each set of gate means has a number of inputs that are connectable to an individual BCD counter means of the number of BCD counter means. The means responsive to signals from the computer, to enable selectively one of the sets of gate means, has outputs that are connected to the sets of gate means and this signal-responsive means is constructed to provide a signal to one of these sets of gate means in response to the nature of the signals received from the computer. The signal-responsive means that operates the storage means to transmit digital information from it to the computer has an output connected to the storage means. A signal from that output to the storage means causes digital information from the outputs of the storage means to be transmitted by address lines connectable to the computer. The system is constructed so that the signal-responsive means to transmit information from the storage means to the computer functions before the other signal-responsive means functions to enable another set of gate means in response to further signals from the computer as the first part of the transfer of digital information from another counter means to the storage means. In other words the construction of the system includes an interrelationship between the two signal-responsive means such that there is a delay in repetition of the function of the signal-responsive means that enables one set of gate means at a time. The time of delay is sufficient to transfer information through an enabled set of gate means to the storage means and then for the other signal-responsive means to transfer information entered into the storage means to the computer before the next digital information is entered into the storage means by the operation of the signal-responsive means that enables the next set of gate means.

In addition to transmitting to the computer digital information from the storage means that has been received from the particular counter means through its associated enabled gate means, one preferred embodiment of the system of the present invention has the storage means constructed with additional inputs to receive and store digital information from the computer that represents in BCD form the decimal number assigned to the counter means from which digital information is to be transferred to the storage means at about the same time by enabling the associated set of gate means for this transfer of information from the counter means identified by that number. In this case the construction of the storage means also has outputs to transmit signals to the computer corresponding to the BCD form entered into the storage means from the computer. Those signals identify the particular counter means from which information is being transmitted to the computer from the storage means. In the one construction of the system of the invention in which the information is transmitted from the storage means to the computer in a serial or seriatim manner, as is the case when using shift register means for the storage means, the BCD information identifying the counter means is preferably transmitted to the computer before transmittal of the BCD information representing the accumulated count in that identifying counter means. In the especially preferred construction in which the digital information in the storage means is transmitted by address lines to the computer in parallel form, the transmittal does not include the transmittal of the BCD data identifying the counter means that is being read, through the use of the system, and transmitted to the computer. In that construction, the computer itself provides that information to its storage section just prior to the transfer to it of the BCD information of the corresponding counter means. The embodiment of the storage means illustratively has data latch means, comprising four data latches, instead of shift register means. The data latch means has additional data latches in which are entered the counter-identifying BCD data, when there is local readout of the various counter means.

The system of the invention also preferably includes, for the area in which the pulse counters are located, an additional construction by which the individual pulse counters can be manually interrogated for their accumulated count and by which the count can be displayed optically or by a printout. This additional construction includes manual display selector means and a digital readout device. The manual display selector means includes a 2-decade BCD switch means that can be manually set to correspond to an identifying decimal number assigned to the counter means to be interrogated. This switch means provides BCD signals at its outputs that correspond to the decimal number manually set. The first decade outputs are connected in parallel with the signal-responsive means that enables selectively one of a part of the sets of register gate means. The second decade output determines which part of the sets is enabled. The system then also has a computer-operated lockout device to prevent a manual readout. Upon receiving a monitor command signal from the computer an output of the lockout device has a change to a voltage level state that inhibits the manual display selector means so that outputs of the BCD switch means can not enable any set of register gate means during the operation of the signal-responsive means for transferring information from any counter means to the storage means and the signal-responsive means for transmitting information from the latter to the computer.

In this especially preferred construction, in which there is a local digital readout of the accumulated count in the manually-selected counter means, there is a BCD-to-decimal decoder for display, either optically or by printout, of the BCD value representing the units, tens, hundreds, etc. of the identifying number of the counter means being read. Of course, for optical display the decoder is one that provides an output that can be one of several forms, such as one with a 10-line output as an input to a Nixie lamp or the like, or a decoder providing seven outputs connected to an incandescent digital readout tube. Of course, there would be a decoder for each of the units, tens, hundreds, etc. of the decoded BCD accumulated count of the interrogated counter means as well as the decoding of the BCD signals representing the decimal number identifying that counter means being interrogated.

When the additional structure for local digital readout is present in the system and the system is the embodiment containing shift register means as the storage means, the system includes data latch means that has inputs that are connected to the outputs of the sets of gate means in parallel with the lines connecting those outputs of the sets of gate means with inputs of the shift register means. In this construction the signal from the computer that operates the means to lock out the functioning of the manual display selector means also prevents a reloading of the data latch means, i.e., a reentering of data in the data latch means. Thus there can be provided no new output data to the decoder and thus to the local digital readout during the reading of accumulated counts in the counter means by the computer. This signal from the computer is the monitor command signal mentioned before as actuating the lockout device for the locking out of the manual display selector.

When the system uses an embodiment in which the storage means is a construction, such as data latch means, so that information from it can be transmitted to the computer in a parallel manner these data latch means can be used as the data latch means for the local digital readout. In that case, in some of the data latches of the data latch means are entered in a BCD manner the BCD count from a specific counter means and in other of the data latches are entered BCD information from the BCD switch means representing the identifying decimal number of that counter means. Each data latch of the data latch means has outputs connected to the inputs of the decoders mentioned above and these are connected to Nixie lamps or digital readout tubes, that are mentioned above, to other optical numerical display means, or to a printout device that may include the decoders in its construction.

The system of the present invention contemplates, as another aspect, a combination that does not include the components required for computer scanning and readout but rather includes a combination only of those components for a local selection of the enabling of any of the sets of gate means and for a local digital readout. Of course, this aspect includes in the combination the data storage means, the sets of gate means and signal-responsive means to provide this local selection and to generate BCD signals corresponding to the decimal number assigned to the BCD counter means to be read. The combination of this aspect can include the sets of BCD counter means.

Also within the scope of the present invention it is contemplated that, when desired, there be included, as an additional aspect, means periodically to sequentially enable each of the sets of gate means for sequential transferring of digital information to the data storage means and transfer of the digital information in the storage means each time it is entered there to a local printout as a record of the accumulated counts in all of the BCD counter means. In this additional aspect of the invention there would be preferably the components, that provide a readout by a computer at a remote location. When there are components for computer readout in this additional aspect of the system, the means periodically to sequentially read out in typewritten form the accumulated counts in the set of BCD counter means can be locked out from operation when there is a computer scan of the BCD counter means. This lockout can be provided by the components for the lock out of manual display selector 53 as in the case of the first and second embodiments.

In view of the foregoing, it is seen that there are contemplated various aspects of the present invention. These aspects relate to the system constructed for local readout without any computer readout. These aspects are useful in the recording of information that can be examined conveniently at the local area or taken elsewhere for study of the events that are occurring in the monitoring of processes.

In the foregoing description of the system of the invention it has been stated that the sets of gate means have their outputs connected to the data storage means and are connectable to the sets of counter means. In another aspect of the system of the present invention the counter means are included as an integral component of the combination of components constituting the system. In that aspect the inputs of the sets of gate means are connected, not merely connectable, to the various counter means with each set of gate means having its inputs actually connected to a different counter means. In this regard, as seen later in connection with the second preferred embodiment of the invention shown in the drawings, it will be noted that the system can include a number of assemblies as cards that are printed circuit boards. On each card there are illustratively five integrated circuits. Each integrated circuit includes a signal conditioner, a counter means connected to the conditioner, and a set of associated gate means connected to the outputs of the n decades of the counter constituting the counter means.

DESCRIPTION OF THE DRAWINGS

FIG. 3 is an electronic circuit diagram of another part of the system of FIG. 1 showing the register selector means that is operated by the computer, showing the manual register selector means to provide input to the set of register gates connected to the four decades of the BCD counter to be interrogated and showing the lockout device circuitry operated by a monitor command signal from the computer.

FIG. 4 is an electronic circuit diagram of another part of the system of FIG. 1, showing circuitry for optical display of digital information from an enabled, manually-selected set of register gates, connected to a particular BCD four-decade counter, by use of display latches and thereby to data display units through decoders.

FIG. 5 is an electronic circuit diagram showing that part of the second embodiment of the system of the invention that differs from the first embodiment, including the use of data latch means instead of shift register means to receive, from a set of register gate means, digital information from a particular four-decade BCD counter and showing, as part of the data latch means, gates that control the transfer of this information from the units data latch of the data latch means and other data latches of the data latch means to the computer. The system of FIG. 5 differs further by the utilization of the data latches, used to transfer information from any BCD counter, also for the optical readout at the local area of the counters.

FIG. 6 is an electronic circuit diagram of other components of the second embodiment of the system showing these components and their interconnections as an overall combination that is an alternative to that shown in FIG. 3 for each selection by the computer or manually of the desired set of register gate means to be enabled for a reading of a particular counter.

DETAILED DESCRIPTION

As seen below in the detailed description of two preferred embodiments of the system of the present invention, they include combinations of many electronic integrated circuits used for different functions. Most of these are TTL integrated circuits that are commercially available from a number of manufacturers. Illustrative are the TTL integrated circuits available from Texas Instruments Incorporated that designates these integrated circuits by type numbers such as SN7401. When a particular TTL integrated circuit is mentioned below it will be suitably identified by such type number that will appear in brackets immediately following the designation of the type of circuit.

Figure 1:
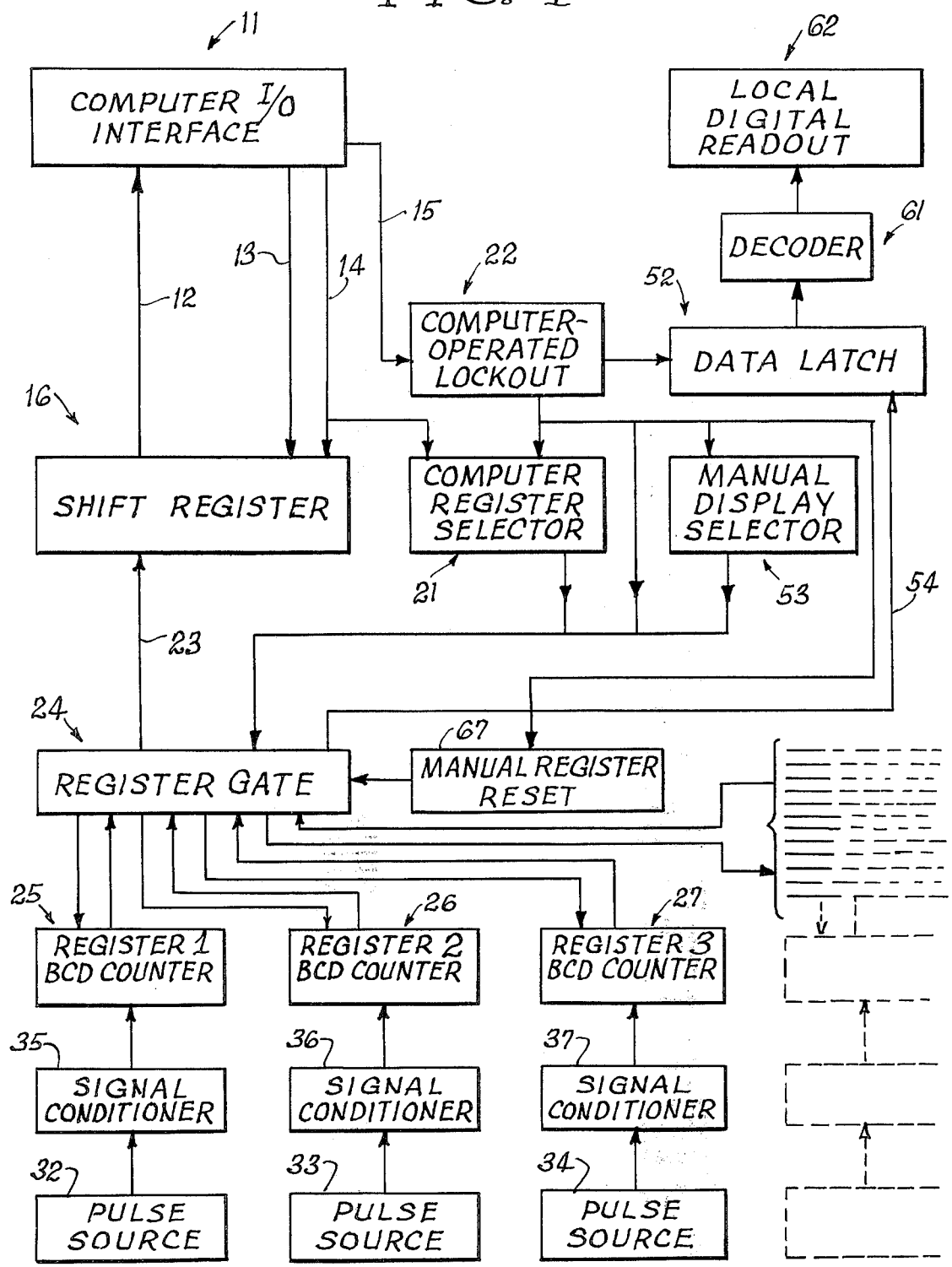
FIG. 1 is a block diagram of one preferred embodiment of the system of the present invention that uses shift register means, to which the digital information in the particular BCD multi-decade counter is transferred by enabling a corresponding set of gates of the gate register means, and from which digital information is transferred to a computer.

Referring to FIG. 1, there is shown a computer input/output interface generally indicated at 11, illustratively, of an IBM 1070 remote terminal of an IBM 1800 computer. The interface 11 is connected in the first embodiment of the system of the invention by four address lines, i.e., four address channels, and a common line, that are shown schematically as a line 12, and by three command lines identified as lines 13, 14 and 15.

Each of the address lines, identified as a unit by line 12, is connected at the other end to outputs of a shift register means generally indicated at 16 that is one type of data storage means. The shift register means 16 comprises four shift registers 17, 18, 19 and 20 (FIG. 2), each being 8-bit shift register [SN74165] with parallel load and serial output.

As seen below in the description of FIGS. 2 and 3, lines 13, 14 and 15 are three pulse-transmitting lines. One of the lines 14 and 15 provides from interface 11 a number of functions including the loading of information data into shift register means 16, the operation prior to this loading of a computer register selector means generally indicated at 21, and a computer-operated lockout generally identified at 22. The lockout 22 prevents manual reading of any counter means of the system while the computer is reading the system with a sequential scanning of the BCD counter means. The second line provides shift pulses to the shift registers. The third line provides a pulse to disable lockout 22 each time that computer scanning is completed.

The shift register means 16 is connected by a schematic line 23 to register gate means generally indicated at 24. In the illustrative construction of this preferred embodiment of the invention shown in FIGS. 1–4 there are fifteen 4-decade BCD counter means, each of which is used to accumulate pulse counts of separate events or conditions. In FIG. 1 there are three of these counter means, that are shown by solid lines, indicated at 25, 26 and 27. These counter means are designated register 1 BCD counter, register 2 BCD counter, and register 3 BCD counter, respectively. The other twelve counter means are merely indicated by phantom lines. These four decades of register 1 BCD counter 25 are shown in FIG. 2 as decade counters [SN7490N] 28, 29, 30 and 31 in which are registered the units, tens, hundreds and thousands of the accumulated count of that counter means. The other counter means are similarly constructed.

At the area where the system is located for use there are, in the illustration, 15 pulse sources, three of which are identified in FIG. 1 as pulse source 32, pulse source 33 and pulse source 34. These provide inputs to BCD counter means 25, 26 and 27 through signal conditioners 35, 36 and 37, respectively. In FIG. 2 it is seen that pulse source 32, after signal conditioning by conditioner 35, provides an input to register 1 units counter 28 of register 1 BCD counter 25. The register 1, units, tens, hundreds and thousands, counters 28 through 31 are connected in a conventional manner by lines (not numbered) so that they constitute register 1 BCD counter 25. The other 14 BCD counter means, as well as their pulse sources and signal conditioners, are not shown in FIG. 2 but, of course, they are present in a similar manner in the system being described as the first embodiment.

The register 1 BCD counter 25 has, for each of its counters 28 through 31, four outputs (FIG. 2) that are connected by lines (not numbered) to four corresponding inputs of a set of register gate means that are identified as register 1 units gate 38, register 1 tens gate 39, register 1 hundreds gate 40 and register 1 thousands gate 41. Each register gate is a quadruple 2-input positive-NAND gate [SN7401N]. The gate 38 has an input connected to a line 42 that is connected also to similar inputs of gates 39 through 41 by lines (not numbered). These lines, including line 42, are used to enable gates 38 through 41 when there is a signal at register 1 gate input 43 that represents schematically the output from register 1 gate driver 44, shown in FIG. 3.

Figure 2:
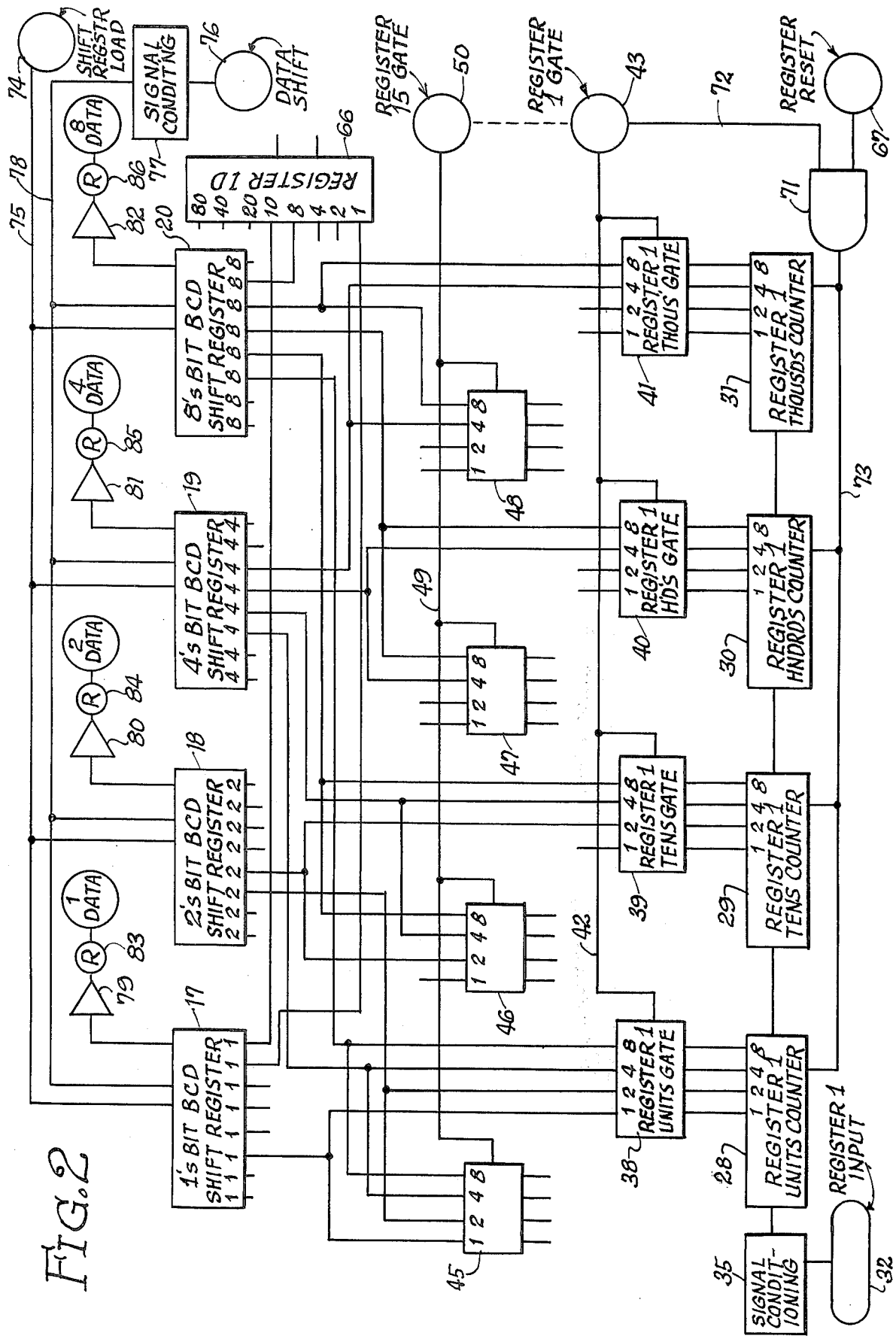
FIG. 2 is an electronic circuit diagram showing a part of the system, shown by a block diagram in FIG. 1, including illustratively fifteen BCD four-decade, pulse counters, the individual units, tens, hundreds and thousands gates of the sets of gate means and their connection to the pulse counters and to four BCD shift registers from which information is transferred by four outputs to address lines connected to the computer.

FIG. 2 shows a register 15 units gate 45, a register 15 tens gate 46, a register 15 hundreds gate 47 and a register 15 thousands gate 48, that constitute the 15th set of register gate means. Each of these gates 45 through 48 has another input connected by a line 49 to a register 15 gate input 50 that receives a signal output from register 15 gate driver 51 (FIG. 3). As seen in FIG. 3 there are 13 other register gate drivers that are not numbered except for superimposed numbers that indicate the specific BCD counter means identified by such number, just as register 1 BCD counter means 25 (FIG. 2), that is connected to the set of register gate means having gates 38 through 41, is used as an identification of register gate driver 44 by the numeral 1 above that gate driver.

The computer-operated lockout 22 has outputs connected to a data latch generally indicated at 52, a manual display selector generally indicated at 53, computer register selector 21, and register gate means 24. The output from lockout 22 prevents the operation of manual display selector 53 and the entering of new data into data latch 52. As seen later, the other signals from lockout 22 provide a signal to computer register selector 21 to make it operative to select the set of register gate means that is to be called for by the next signal from the computer through line 14. Also the lockout 22 provides a signal to register gate means 24 so that the next set of register gates of register gate means 24 is enabled by the operation of selector 21.

The data latch 52 is connected to register gate means 24 by a line 54 that represents fifteen sets of 16 lines. The data latch 52 is a data latch means having six display latches 55 through 60 (FIG. 4). These display latches are 4-bit bistable latches [SN7475N]. The display latch 57 has four inputs that are connected to the corresponding 8, 4, 2 and 1 outputs of register 1 thousands gate 41 by four of one set of 16 lines shown by schematic line 54 of FIG. 1. The 8, 4, 2 and 1 inputs of each of data latches 58 through 60 are correspondingly connected, each by four lines of that one set of lines, to the 8, 4, 2 and 1 outputs of register 1 hundreds gate 40, register 1 tens gate 39 and register 1 units gate 38. These four inputs of each of display latches 57 through 60 are similarly connected by the other sets of 16 lines to the other 14 sets of register gate means. As seen in FIG. 1 data latch 52 is connected through a decoder generally indicated at 61 to a local digital readout generally indicated at 62. The display latches 55 and 56 are connected to manual register-selector switch means generally indicated at 63 (FIG. 3), having a units BCD switch 64 and a tens BCD switch 65. The switch 64 has its 8, 4, 2 and 1 outputs connected to the corresponding inputs of display latch 56. The switch 65 can have its 8, 4, 2 and 1 outputs connected to the corresponding inputs of display latch 55; however, in the illustrated construction in which there are less than 20 (actually only 15) counter means only the 1 input of display latch 55 is connected to the 1 output of switch 65.

Except for computer input/output interface 11 all of the components shown in FIG. 1 are located at the one area while the computer is located conventionally at another area.

As described later in a description of FIG. 3, computer register selector 21 provides outputs to the first two inputs of each of BCD shift registers 17 through 20. The outputs of the computer register selector 21 occur only as a part of a corresponding by the computer of the various counter means. These outputs from selector 21 are collectively identified in FIG. 3 as register ID 66 that comprises the BCD signals corresponding to the decimal number of the counter means to be read. That block identified as register ID 66 is shown in the lower righthand side of FIG. 3 and repeated in the upper right-hand part of FIG. 2. In FIG. 2 only two input lines to register ID 66 are shown but it is understood that the lower line represents four input lines for 8, 4, 2 and 1 inputs correspondig to the BCD of the units part of the number assigned to the counter means to be read as a result of the loading of the shift registers 17 through 20 by command signals from the computer. The upper input line for the register ID 66 represents the "10" value of the counter means and it provides a signal if the counter means to be read is one of counter means 11 through 15. The "10" output from selector 21 is connected from register ID 66 to the right-hand end of BCD shift register 17. The register ID 66, as shown, indicates that there can be different "tens" output when the number of counter means is greater than 20. If the number of counter means were at least 21 and no more than 40 the "20" output of register ID 66 would be connected also to the right-hand end input of BCD shift register 18. Similar connections would be made also to the right-hand end of the inputs of BCD shift registers 19 and 20 if the number of counter means were at least 41 and at least 81, respectively.

In this illustrative embodiment of the system of the invention, BCD shift registers 17 through 20 shift to the right with the two inputs at the right-hand end being the tens and units of the identifying number for the counter means that has been selected by the computer. The next input from the right-hand end of these shift registers is the input of the BCD information from one of the register thousands gates. The next input for these shift registers is for the BCD information from one of the register hundreds gates. The next input to the shift registers is for the entering of information from one of the tens gates. The sixth input from the right for these four shift registers is for the entering of BCD units data of the accumulated count in that counter means that is associated with that set of register gates that has been enabled for the reading at that time period by the computer. The two inputs that are at the left-hand end of each of registers 17 through 20 are not used in this illustration that only describes the use of this embodiment of the system in which the accumulated count of each counter means is less than ten thousand counts.

Because the shift registers are used in this embodiment of the system in a manner to shift to the right, the inputs for the units, tens, hundreds and thousands are connected as shown in FIG. 2. Of course, one could use shift registers that would shift to the left. In that case the connections to register ID 66 would be to inputs from left to right into shift registers 17 through 20. Also the connections of these shift registers to the individual gates of the fifteen sets of register gate means would be different than that described below.

Because the shift registers 17 through 20 are registers that shift to the right the connections with the various counter means are shown in FIG. 2 by a sufficient number of connecting lines that illustrate the pattern of these connections. It is seen in FIG. 2 that the 8's bit output of register 1 thousands gate 41 is connected to the third (from the right) input of 8's bit BCD shift register 20. The 8's bit output of the other 14 thousands gates are also connected to the 8's bit input of shift register 20. This is illustrated by the line from the 8's bit output of register 15 thousands gate that is connected to the line that connects the 8's bit output of register 1 thousands gate 41 to the 8's bit input of register 20. Similarly the 4's bit, 2's bit, and 1's bit outputs of the fifteen register thousands gates are connected to the 4's, 2's and 1's bit inputs (third from the right) of BCD shift registers 19, 18 and 17, respectively.

The four outputs of the fifteen register hundreds gates are similarly connected to the fourth (from the right) inputs of BCD shift registers 20, 19, 18 and 17. The same pattern of connection is provided for the fifteen register tens gates and fifteen register units gates that are connected, of course, to the fifth and sixth inputs, respectively, of these four BCD shift registers.

Referring further to FIG. 2, there is shown at the bottom right-hand corner of the drawing a register reset signal 67. In FIG. 3 this register reset 67 is also shown in the lower central part of the drawing as the output of a positive AND gate 68 [SN7408N]. As seen later, the gate 68 can have an output when the computer is not reading the various counter means because then gate 68 can have the two positive inputs. A manual reset switch 69 (normally closed) is connected to one input of gate 68. The other input signal to gate 68 is provided by a line 70 that is connected to the $\overline{Q}$ output of computer-operated lockout 22 (shown in FIG. 1 as well as FIG. 3). The register reset signal 67 is a positive input signal to a positive AND gate 71 [SN7408N] when manual reset switch 69 is opened, if the signal in line 70 is positive. If then manual register selector switch 63 is set for register 1 gate to provide by a line 72 the register 1 gate input 43 as the second positive input to AND gate 71, there is an output signal from gate 71.

Connected also to each of the other register gate inputs, such as register 15 gate input 50, is a line, like line 72, that is connected at its other end to an AND gate, like AND gate 71, to provide its second input. The other input to each of these additional AND gates 71 is connected to a register reset signal, like reset 67 and in each of these cases it is the output of an AND gate, like AND gate 68, having a first input with a manual reset switch, like switch 69, and a second input connected to line 70.

By manually setting switch means 63 for a particular counter means and opening the corresponding manual reset switch 69 there is a resetting of that counter means. This is because the output of AND gate 71 provides a signal to clear the four-decade counters of that counter means. As seen in FIG. 2, the output of AND gate 71 is connected by a line 73 and branch lines (not numbered) to register 1 counters 28 through 31. That output signal clears these counters.

When a signal is provided as a shift register load signal 74 (upper right-hand corner of FIG. 2 and lower right-hand corner of FIG. 3), that signal by a line 75 and branch lines (not numbered) is provided to an input of each of BCD shift registers 17 through 20 whereby ID information in BCD form of a counter means, that is schematically illustrated as present in BCD register ID 66, is entered into the first two inputs of each of these four registers. Loaded or entered into the next four inputs is BCD information of the accumulated count in that counter means. Of course, to do this the register gate means associated with that counter means is enabled. The register ID BCD information, of course, corresponds to the number identifying the counter means to have its accumulated count entered into the four shift registers that constitute one register means. For example, when register 1 gates are enabled the count in register 1 counters 28 through 31 are loaded into BCD shift registers 17 through 20. At about the same time the units value, identifying that counter means, is entered into the second input of BCD shift register 17. As a further illustration, if register 15 gate is enabled the "10" output, as a signal from selector 21 (FIG. 1), is entered into the first input of BCD shift register 17 and the "4" and "1" outputs from selector 21 are entered into the second inputs of BCD shift registers 19 and 17, respectively.

After loading the BCD shift registers 17 through 20 the computer provides six separate pulses for data shift identified by data shift 76. These pulses are received from the computer by one of the command lines to the system. Each pulse is an input to a signal conditioning device 77 that, being a retriggerable monostable multivibrator, provides a short pulse beginning at the trailing edge of the input pulse. The signal conditioning device 77 provides this short pulse after that delay by a line 78 and branch lines (not numbered) as inputs to BCD shift registers 17 through 20 to shift them to the right. Before each shift to the right the output of these four shift registers is transmitted in parallel as 1 data, 2 data, 4 data and 8 data inputs to the computer. Each of these outputs of registers 17 through 20 is transmitted by being inputs to inverters 79 through 82, respectively. The outputs of each of inverters 79 through 82 is connected to a relay 83 through 86, respectively, that when operated by an output by the associated inventer provides a signal to the computer.

The computer is provided with a specific program to read the accumulated counts of the 15 couner means for a sequential scanning of the 15 counter means. The cycle of operation for scanning is completed quite rapidly, as is understandable. The cycle is repeated periodically with a time interval between each scan as desired. For example, scanning can be initiated every 15 minutes. It is possible to have a local digital readout of a number of the counter means during most of each 15-minute interval.

A particular counter means to be read locally is selected manually by setting BCD switches 64 and 65 of selector switch means 63. The BCD values of the units of such selection provides the appropriate voltage at up to three of the outputs of BCD switch 64 and, if the counter means is one identified by a number greater than 10, the tens value is obtained as an output of BCD switch 65. The 1, 2, 4 and 8 outputs of BCD switch 64 are connected by lines (not numbered) to lines 87 through 90 that are connected to the corresponding input of a register selector gate 91 and the corresponding inputs of a register selector gate 92. Each of register selector gates 91 and 92 comprises quadruple 2-input positive-NAND gates [SN7401N] as are the two sets of register gates 38 through 41 and 45 through 48 and the other thirteen sets of register gates for the gating individually of BCD information from the other thirteen counter means. The 1, 2, 4 and 8 outputs of gate 91 are connected by lines (not numbered) to another gate 93 that comprises quadruple 2-input positive-NAND gates [SN7400N]. Similarly, the 1, 2, 4 and 8 outputs of gate 92 are connected by lines (not numbered) to the corresponding inputs of another register gate 94 [SN7400N]. The outputs of BCD switch 65 are connected by two lines (not numbered) to the set and preset inputs of a decade selector 95 which is a J-K flip-flop [SN7476N].

The decade selector 95 has, of course, a Q output and a $\overline{Q}$ output. The former is connected by a line 96 to an input of register selector gate 94 to enable that gate when the level of the Q output of decade selector 95 is positive. Similarly, the $\overline{Q}$ output selector 95 is connected to an input of register selector gate 93 by a line 97 to enable gate 93 when the $\overline{Q}$ output is positive. Thus it is seen that decade selector 95 enables gate 93 or gate 94 dependent on the state of decade selector 95. The decade selector 95 is changed, for a manually-selected readout, from one state to the other when one of the two outputs of BCD switch 65 is changed but this change is inhibited by an input signal to switch 65 by a line (not numbered) connected to a line 98. That signal is produced at the start of a readout by the computer, as described later.

When the computer initiates a readout of the fifteen counter means by sequential scanning of them, a pulse signal is provided by one of the control lines from the computer to the system. This signal is designated as system execute 99 that also designates subsequent signals described below. This first signal from the computer, as are the subsequent signals, is an input signal to a signal conditioning device 100 that is a retriggerable monostable multivibrator [SN74123N]. The output of signal conditioning device 100 is connected by a line 101 to an input of a computer-operated register selector 102 that is a decade counter [SN7490N]. The selector 102 has BCD outputs that are connected to the corresponding inputs of a register selector gate 103 that comprises quadruple 2-input positive-NAND gates [SN7401N]. In addition these outputs of selector 102 are connected to the corresponding inputs of a register selector gate 104 of the same type, as well as providing the signals to the corresponding inputs of BCD register ID 66. The 10 value input of register ID 66 is connected to line 97, as indicated by a circle identified as "B", to provide that input at the logical level when register selector gate 93 is enabled by $\overline{Q}$ of decade selector 95 being at the positive logic level.

The register selector gate 103 has its BCD outputs connected to the corresponding inputs of gate 93 that are also connected to register selector gate 91 as described above. Similarly, the BCD output of register selector gate 104 is connected to the corresponding inputs of gate 94 that are connected also to register selector gate 92 as described above.

In FIG. 3, register selector gate 92 is shown with connections to ground and the voltage Vcc. Of course, selector gates 91, 92 and 103 are similarly connected to ground and Vcc, as are other TTL integrated circuits.

The first system execute signal provides the signal in line 101, as mentioned above. This signal is carried by a line 105 connected to line 101. The line 105 is connected to an input of computer lockout 22 that is J-K flip-flop with preset and clear [SN7476N]. This signal to computer lockout 22 by line 105 clears the flip-flop, that is, computer lockout 22. As a result there is a change in the voltage level of the Q output that is connected by a line 106 to decade counter 102, and that had set that decade counter to zero at the end of a previous computer scanning. The conditioning device 100 is connected also by line 105 to a signal delay device 107 as well as to computer lockout 22.

The device 107 is a retriggerable monostable multivibrator [SN74123N] that after the delay provides a shorter pulse to an inverter 108 having its output providing a signal to shift register load 74 that enables BCD shift registers 17 through 20 to have entered into them the BCD ID information from BCD register ID 66. Also entered into them is the accumulated count in BCD counter means 1, i.e., the BCD information in register 1 counters 28 through 31, because register 1 gate driver 44 has provided, during the delay provided by signal delay device 107, a signal to register 1 gate 43 that enables gates 38 through 41. This enabling of register 1 gate 43 is obtained by the first pulse of system execute 99 from the computer. That pulse is entered also into decade counter 102 and by its "1" output to the "1" input each of register selector gates 103 and 104 as well as the the "1" input of BCD register 66. The register selector gate 93 is not enabled at this time in view of the present condition of decade selector 95. The register selector gate 94 is enabled whereby register gate driver 44 is provided a signal to enable register 1 gate.

At the time that computer lockout 22 is provided an input by line 105 from signal conditioning device 100 the voltage level of the $\overline{Q}$ output of computer lockout 22 is changed. That output is connected by an inverter 108' to an input of register selector gate 104 whereby it is enabled. That $\overline{Q}$ output at computer lockout 22 is also connected by an inverter 109 to an input of register selector gate 103 so that it is also enabled. The register selector gate 93 is not enabled because of the condition of decade selector 95. Each of register selector gates 91 and 92 has an input also connected to the $\overline{Q}$ output of computer lockout 22 but they are connected directly, rather than through an inverter, so that neither is enabled at this time.

The BCD outputs of register selector gate 94 are connected to corresponding inputs of a BCD-to-decimal decoder 110 [SN7442N] that has ten outputs. Each of the ten outputs is connected to one of the register gate drivers that provides signals to individual register gates. These ten register gate drivers are identified in FIG. 3 as register 1 gate driver through register 10 gate driver. The register 1 gate driver is driver 44.

The BCD outputs of register selector gate 93 are connected to corresponding inputs of another BCD-to-decimal decoder 111 [SN7442N]. There are, of course, ten outputs of decoder 111 but only five are used in this example. These outputs are connected to the other five register gate drivers identified as register 11 gate driver through register 15 gate driver. Each gate driver, when provided with an input, provides an output signal to one of the register 11 through 15 gates for the other five counter means. As mentioned earlier, register 15 gate driver is driver 51.

At the end of the previous computer reading operation the lockout 22 receives by a command line from the computer a pulse to preset computer lockout 22, i.e., the computer-operated flip-flop that locks out any manual readout during a computer sequential scanning of the fifteen counter means. This pulse by presetting this flip-flop disables its $\overline{Q}$ output and enables the Q output. The resultant voltage in the Q output sets decade counter 102 to zero.

The first pulse of system execute 99, after signal conditioning by device 100, provides a clear input signal to computer lockout 22 whereby the Q and $\overline{Q}$ outputs of lockout 22 change state. When decade counter 102 receives this first pulse from line 101, it provides a clock signal designated as "A" to decade selector 95 whereby its Q output connected to line 96 enables register selector gate 94. The voltage level of the $\overline{Q}$ output is now such that register selector gate 93 is disabled. At the same time the 10 input of register ID 66 no longer has the voltage input signal from a previous sequential scanning because the signal identified as "B" from line 97 is now at the 0 level. p The first pulse of system execute 99 has provided the $\overline{Q}$ output of computer lockout 22 at the 0 level. That output is connected by inverter 108' to register selector gate 104. As a result, gate 104 is enabled. This is prior to the second pulse of system execute 99. Also register selector gate 94 is enabled by the clock pulse "A" to decade selector 95 when computer-operated register selector 102 was reset to 0.

This first pulse of system execute 99 to decade counter 102 provides an output at one of the four outputs of decade counter 102. This provides a signal to the "1" input of BCD register ID 66 and to the corresponding inputs, now enabled, of gates 103 and 104. The enabled register selector gate 104 passes this signal to the corresponding input of register selector gate 94, also enabled, to provide an input to decoder 110 whereby a signal is provided to register gate driver 44. The driver 44 provides an output signal to register 1 gate for the enabling of register 1 gates 38 through 41. This occurs during the delay provided by signal delay device 107 after the input of the second signal of system execute 99. After that delay, the pulse from device 107 to inverter 108 provides a signal to shift register load 74 by which the information in BCD register ID 66 is transferred to the second input 1's bit BCD shift register 17 and the accumulated count in register 1 counters 28 through 31 is transferred to the third through sixth inputs of shift registers 17 through 20.

Before the next pulse from the computer to system execute 99 to be counted by decade counter 102 and then after a delay to provide a signal to shift register load 74 for the entering into shift registers 17 through 20 of the accumulated count in register 2 counters, four address lines to the computer are used to read and enter in the computer the bit information in shift registers 17 through 20 by using amplifiers 79 through 82 and relays 83 through 86. Each of these amplifiers has its input connected to an output of the corresponding shift register that has a logic level corresponding to the right-hand end input of that shift register. Because only one pulse has been counted by decade counter 102, the accumulated count in register 1 counters is to be read and entered after the reading of its corresponding ID information in register ID 66. The BCD register ID 66 does not have a voltage signal at its "10" output. Thus the 1, 2, 4 and 8 "tens" data being read and entered into the computer are all 0's.

The computer by a command line then provides a pulse to data shift 76. This pulse is an input to signal conditioning device 77 that provides, as described earlier, a shorter pulse to an input of each of shift registers 17 through 20 whereby they shift once to the right. There are six impulses to data shift 76. During each delay of providing the shorter pulse from signal conditioning device 77 there is a shift to the right in each of shift registers 17 through 20 and a reading and entering of the right-hand end bit of information of each shift register by the four address lines. Thus, after the first shift there is the reading of the ID information representing the digital value of BCD data of the units part of the ID number. Then in sequence due to the next four shifts there is the reading and entering into the computer the BCD information of the thousands, hundreds, tens and units of the accumulated count in register 1 counter means, i.e., in register 1 counters 31, 30, 29 and 28, respectively.

After these five input pulses of data shift 76 and the readings and entering of the BCD information loaded into shift registers 17 through 20, there is that sixth pulse from data shift 76. The shift registers 17 through 20 are no longer loaded.

Subsequent to the sixth pulse of data shift 76 and the delay provided by signal conditioning device 77 there is no reading by the computer of the shift registers 17 through 20 by means of the address lines until data from the next counter means has been loaded into these shift registers. This next loading is initiated by the second pulse from system execute 99 to provide an input to decade counter 102 and subsequently to shift register load 74. The decade counter now has a signal at its second output instead of its first. This signal passes through previously enabled gates 104 and 94 into decoder 110 that then provides, instead of an input to register gate driver 44, an input to the next register gate driver that has an output for register 2 gate. Thereby register 2 units gate, register 2 tens gate, register 2 hundreds gate and register 2 thousands gate are enabled. The third through sixth inputs of shift register 17 through 20 are loaded with the BCD values of register 2 counter means when these register 2 gates are enabled. At that time also the input to BCD register ID 66 and thus its output signal are changed. This output signal is entered into the next to the right-hand end input of shift register 18. Then the sequential reading and entering into the computer of the BCD information in the 6 bits of each of the four shift registers is provided by using the four address lines. The sequential reading of the second through sixth sets of bits is made by a reading after each of five pulses of a new series of six pulses to data shift 76 as described above for the reading of the BCD ID information in register 66 representing the count in decade counter 102 and the BCD information loaded into registers 17 through 20 from register 1 counter means.

This process of reading and entering into the computer the BCD information in the rest of the fifteen counter means is conducted in the same manner. After the loading into the shift registers 17 through 20 the BCD information of the four register counters of register 10 counter means there is a signal from an output of decade counter 102 when it receives the next pulse, i.e., the eleventh pulse, to initiate the reading of register 11 counter means. This pulse designated "A" is a clock pulse that is provided as a clock input of decade selector 95. That clock impulse changes the condition or state of flip-flop 95. Then the Q output of flip-flop 95 is at the logic level such that gate 94 is disabled and $\overline{Q}$ output is now at the logic level to enable gate 93. At the same time the signal now in line 97 that is connected to the $\overline{Q}$ output provides a signal "B" to a line that is connected to the first input of the BCD tens part of register ID 66. The corresponding output of register ID 66 provides a signal to the right-hand end input of BCD shift register gate 17. That eleventh pulse from system execute 99 is counted, of course, in decade counter 102 as a count of one to provide an output to the BCD register ID 66 and through enabled gates 103 and 93 and through BCD-to-decimal decoder 111 to the eleventh register gate driver whereby register 11 gate has a signal that enables register 11 gates, for the passage of BCD data from register 11 counter means, to load, upon a signal of shift register load 74, shift registers 17 through 20 along with the loading to BCD units and tens information from register ID 66. Before the next pulse to decade counter 102 by system execute 99 the computer reads and enters the BCD data in shift registers 17 through 20 in the manner described above for other counter means. This operation is repeated each time there is a pulse from system execute 99 until register 15 counter means has been read and entered into the computer. Then the computer enters a signal by the third command line to restore the system to its initial condition in which it can be manually selected for a local readout of accumulated count in any one of the fifteen counter means. This command signal is a pulse by a line 112 from that source designated as manual selector lockout 113 (FIG. 3). The pulse is provided by line 112 to the preset input of flip-flop 22 to change the state of the Q and $\overline{Q}$ outputs. When the Q output is thus changed, decade counter 102 is set to zero. The $\overline{Q}$ output, being changed, no longer provides the enabling signal from that output to register selector gates 103 and 104 through inverters 109 and 108', respectively. The $\overline{Q}$ output, being connected also to inputs of register selector gates 91 and 92, now enables these gates.

The gates 91 and 92 are a part of manual display selector 3. Another part is BCD switch means 63. This change of state of $\overline{Q}$ output of computer lockout 22 ceases the inhibit signal to BCD switch 65 that had been provided by a line (not numbered) and line 98 that connect the input of BCD switch 65 to the $\overline{Q}$ output of computer lockout 22. Prior to that change the $\overline{Q}$ output was the other logic level obtained by a change of state of computer lockout 22 when its clear input received a signal by line 105. The signal was obtained as a result of the first pulse from system execute 99 at the initiation of a sequential scanning by the computer.

When the Q output of computer lockout 22 is changed in state by a signal from manual selector lockout 113, that removes the inhibit signal to an input of BCD switch 65, so that switch 65 is enabled, as mentioned above. As a result the BCD switch 65 provides a signal by the voltage levels of its two outputs, connected to the clear input and to the preset input of decade selector 95, being such that decade selector 95 is cleared and gate 94 is enabled while 93 is disabled. If BCD switch means 63 is manually set to locally readout one of the counter means that has an identifying number less than the number 11, the setting of switch means 63 provides no change in the outputs of BCD switch 65. The register selector gate 94 remains enabled. The register selector gate 93 remains disabled. If BCD switch 63 is manually set to provide a local readout of one of the counter means 11 through 15 the other output of BCD switch 65 provides an input signal to the preset of decade selector 95 whereby the $\overline{Q}$ output enables gate 93 and provides a signal to the "10" input of register 66 and the Q output no longer enables gate 94.

For this specific local readout of any one of the fifteen counter means there will be one or more signals from the 1, 2, 4 and 8 outputs of BCD switch 64 to the corresponding inputs of now enabled gate 91 and now enabled gate 92. These gates provide corresponding outputs to gates 93 and 94, respectively, but the use of their outputs is dependent upon which one of these gates is enabled by the state of decade selector 95. The enabled gate (93 or 94) provides an input to BCD-to-decimal decoder (111 or 110, respectively) that provides the output to the driver for the register gate means corresponding to the counter means being interrogated by the manual selector.

It is seen that manual display selector 53 includes BCD switch means 63 and gates 91 and 92. It further includes gates 93 and 94, decoders 110 and 111, and decade selector 95 that are also used as components of computer register selector 21 that further includes register selector gates 103 and 104, and computer-operated register selector 102.

At the time of initiation of sequential scanning of the fifteen counter means by the computer by a pulse from system execute 99 that provides a signal through line 105 to computer lockout 22 there is a change of the state of its $\overline{Q}$ output. That output is connected by a line 114 to an amplifier 115. The output of amplifier 115 is connected to a manual display lockout 116 (shown at the bottom right-hand portion of FIG. 3 and at the bottom left-hand portion of FIG. 4). As seen in FIG. 4, manual display lockout 116 is connected to an input of an amplifier 117. A line 118 is connected to the output of amplifier 117. Each of display latches 55 through 60 has an enable input that is connected to line 118 directly or by branch lines (not numbered) that are connected to line 118.

When computer lockout 22 is cleared by the first pulse of system execute 99 for a sequential computer scanning, a $\overline{Q}$ output of computer lockout 22 is at the voltage level that does not enable latches 55 through 60. When the scanning is completed and the computer provides the pulse through manual selector lockout 113 to change the state of computer lockout 22, the $\overline{Q}$ output of the latter provides a signal by manual display lockout 116, amplifier 117, line 118 and unnumbered lines from its output to enable latches 55 through 60.

As seen in FIG. 4, each of display latches 55 through 60 has 1, 2, 4 and 8 inputs and four corresponding outputs that are connected to corresponding inputs of display decoders 119 through 124, respectively. Each of these six display decoders is a 4-line-to-10-line decoder [SN7441AN]. Each display decoder has ten outputs that are connected to a nixie lamp, such as commercial nixie lamp NL840.

The nixie lamps 125 and 126 are thus connected to display decoder 119 and 120, respectively. These lamps display the tens and units, respectively, of the decimal number identifying the counter means being displayed by the manually-selected readout. To provide this readout the inputs of display latches 55 and 56 are suitably connected to BCD switch means 63. Because in this illustration there are only fifteen counter means the 2, 4 and 8 inputs of display latch 55 do not receive a signal from switch means 63. It will not be set for any number greater than 15. As a result, nixie lamp 125 will display either an "0" or a "1". The nixie lamp 126 will display one of the ten digits ("0" through "9") dependent upon the manual setting of switch means 63.

The other four nixie lamps, i.e. lamps 127, 128, 129 and 130 display the decimal digits of thousands ($10^3$), hundreds ($10^2$), tens ($10^1$) and units ($10^0$) respectively of the accumulated BCD count in the counter means being displayed when display latches 57 through 60 are enabled and the register gate means associated with that counter means is enabled by the operation of manual display selector 53. To provide this display through enabled display latches 57 through 60 the 1, 2, 4 and 8 inputs of these display latches are connected by lines to the 1, 2, 4 and 8 outputs of each of the fifteen register gate means in the manner described below. The inputs of display latch 60 are connected to the corresponding outputs of each register units gate, e.g., register 1 units gate 38, of the fifteen register gate means, i.e., of the fifteen sets of four register gates. The display latch 59 has its inputs connected to the corresponding outputs of each of the fifteen register tens gates, e.g., register 1 tens gate 39. The inputs of display latch 58 are connected to the corresponding outputs of each of the fifteen register hundreds gate, e.g., register 1 hundreds gate 40. Similarly, the inputs of display latch 57 are connected to the corresponding outputs of each of the fifteen register thousands gate, e.g., register 1 thousands gate 41. The nixie tubes 127 through 130 thus display in decimal form the accumulated BCD count in any counter means that has its set of register gates enabled by BCD switch means 63.

The second preferred embodiment of the system that is shown in FIGS. 5 and 6 is fundamentally the construction of the system of the first embodiment shown in the block diagram of FIG. 1 except for the fact that a different storage means is used. In the system of FIG. 1 the storage means is shift register 16 whereas in the embodiment of FIGS. 5 and 6 the storage means is data latch means generally indicated at 135 that comprises in this illustration six data latches. These data latches are data latches 136 through 141. Each of data latches 136 through 141 is a 4-bit bistable latch [SN7475]. These six data latches are used as data latch means 52 (FIG. 1). Four of them are used as the storage means in lieu of shift register 16 of the first embodiment. The other two, namely, data latches 136 and 137, are not a part of the storage means that is the substitute for shift register 16; however, they and the other four data latches serve as data latch means 52 to provide output signals to decoder 61 for local digital readout.

Because the second embodiment of FIGS. 5 and 6 contains data latches 138–141 instead of shift registers 17–20 as the data storage means the transfer of BCD information representing an accumulated count in a particular counter means is transferred to the computer from data latches 138 through 141 at the same time rather than transferring to the computer each combination of the 1's bits, 2's bits, 4's bits and 8's bits for the thousands, hundreds, tens and units BCD information of the accumulated count by a series of steps that is required when using BCD shift register means 16, e.g., BCD shift registers 17 through 20. As a result the number of address lines required are one common line and sixteen lines for the four sets of BCD information in the particular 4-decade BCD counter means. This compares with the use of one common line and four address lines, represented by line 12 in FIG. 1 for the first embodiment of the system. However, that number is unchanged regardless of the number of BCD counter means at the local area. Thus it is similar to the first embodiment of FIGS. 1–4.

When there is a provision also for local digital readout, as is the case for a system described in FIGS. 5 and 6, this transfer to the computer of BCD information at one time from latches 138 through 141 by sixteen address lines requires in the system computer input gate means generally indicated at 142 that comprises computer input gates 143 through 146. These computer input gates are at the local area containing the other parts of the system and the various BCD counter means that are to be read by the computer and by a manually-selected readout. Each of computer input gates 143 through 146 has its BCD inputs connected by lines (not numbered) to the corresponding BCD $\overline{Q}$ outputs of a coresponding one corresponding data latches 138 through 141, as shown in FIG. 5. Those BCD $\overline{Q}$ outputs of data latches 138 through 141 are connected also to BCD inputs of display decoders 147 through 150, respectively, of decoder 61. The display decoders in this embodiment are BCD-to-seven-segment decoder/drivers [SN7446]. For clarity, the latter connections in FIG. 5 are shown by separate lines (not numbered) connected to $\overline{Q}$ outputs of data latches 138 through 141 that appear to be different $\overline{Q}$ outputs than those connected to gates 143–146. Actually these outputs are the thousands, hundreds, tens and units BCD $\overline{Q}$ outputs of latches 138 through 141 that are connected to computer input gates 143 through 146. The output of each of display decoders 147 through 150 is connected by a line (not numbered) to an incandescent digital readout tube. These are tubes 151 through 154, respectively, of local digital readout 62. These tubes are available from various sources, including RCA.

The data latches 136 and 137 have their BCD $\overline{Q}$ outputs connected to corresponding inputs of display decoders 155 and 156, respectively, also constituting a part of decoder 61. The display decoders 155 and 156 are of the same type as decoders 147 through 150. Other incandescent digital readout tubes 157 and 158 have their inputs connected to the outputs of decoders 155 and 156 by lines (not numbered). The tube 157 displays the tens decimal digit of the decimal number identifying the counter means being interrogated by computer selection or manual selection, whereas tube 158 displays the units decimal digit of the decimal number identifying that counter means. For this display of the identifying number of the counter means by tubes 157 and 158 the BCD information entered into latches 137 and 138 is based on the BCD information for units and tens value provided by the "register ID" shown in the upper left-hand corner of FIG. 5 as input signals 1, 2, 4, 8, 10 and 20 to data latches 136 and 137. For a manually selected readout the first four of these signals are based on the BCD units outputs of BCD switch 64 and the other two are based on the BCD tens outputs of BCD switch 65, both shown in FIG. 6. The switches 64 and 65 (FIG. 6) are the components of switch means 63 in this embodiment. Of course, as in the first embodiment they are manually set to select the local interrogation of a thus-designated counter means.

Each of these display decoders 147 through 150 and decoders 155 and 156 has a conventional lamp test input connected to a line 160 that is connected to a lamp test voltage signal 161 by which tubes 151-154 and tubes 157 and 158 can be tested for operativeness.

Each of the BCD outputs of each of computer input gates 143 through 146 is connected by a line (not numbered) to one of optical isolators generally indicated at 163, such as optically-coupled isolator TIL 112. As seen in FIG. 5, each of these isolators is connected to a +5V supply and to the common line, mentioned above, that extends with the sixteen address lines between the system and the computer as the data line portion of a computer communications bus. These sixteen address lines are connected to outputs of the isolators as shown in FIG. 5. The address line 1, 2, 3 and 4 receive signals from four of the isolators based on the output signals at the 1, 2, 4 and 8 outputs of gate 146 that are based on the units BCD value of the counter means being interrogated by the system. These values have been entered into data latch 141. Similarly, the BCD signals in address lines 5 through 8 are based on the tens BCD value, the BCD signals of address lines 9 through 12 are based on the BCD hundreds value and the 13 through 16 signals to the address lines are based on the BCD thousands value in that counter means.

The register ID signals shown in the upper left-hand corner of FIG. 5 is shown in the upper right-hand corner of FIG. 6 where they are identified by the same numbers preceded in each case by the term "BCD". These signals of the register ID are for local readout only, as indicated in FIG. 6. This means that there is local readout by tubes 157 and 158 of BCD data entered into data latches 136 and 137, respectively, identifying the tens and units digits of the counter means having its information entered into those data latches. At any particular time this information displayed by tubes 157 and 158 represents the last readout. That readout may have been a computer readout or a readout by a manual selection. The signals to this register ID, as a result of either type of readout, is obtained in the manner described later.

The second embodiment of the system of the invention, that is illustrated by FIGS. 5 and 6, in a construction in which there are thirty BCD counter means, has their accumulated counts read and entered into the computer or read locally with manual selection. This second embodiment has a construction for computer readout such that the reading can be a reading of any one or more of the counter means in any programmed order. The computer can be programmed for various changes of readout. Thus for each readout operation the program in the computer will determine those counter means to be read at that time and determine the order in which they are to be read. Thus the second embodiment of the system is more versatile. It permits different time intervals for reading different counter means and different sequential readouts of the various counter means. It is a selective scanning by the computer of the various counter means rather than a sequential scanning of all of the counter means.

The sequential scanning of the various counter means is required by the first embodiment of the system because it utilizes in the system a decade counter, namely, computeroperated register selector 102, that receives pulses from the computer to step in sequence for a sequential reading or scanning in a particular order of some or all of the various counter means. As seen in FIG. 6, the computer, when using the second embodiment of the system of the invention, need not scan in any particular order. At different intervals the computer can scan different combinations of the various counter means. Instead of using one command line to provide pulses for a scanning, as is the case for a first embodiment, the computer in the second embodiment provides binary information by command lines of the driver line portion of the computer communications bus. This binary information via the driver line portion of the computer communications bus is provided as the six signal sources generally indicated at 165 shown in the upper right-hand corner of FIGS. 6. These signal sources are connected to six optical isolators generally indicated at 166 to provide six signals to the six inputs of hex inverter drivers 167 [SN7405] so that the input of inverter drivers 167 corresponds to the logic levels of the signal sources 165. The inverter drivers 167 provide a 6-bit binary output that is the complement of the 6-bit binary information in signal sources 165.

A binary-to-BCD comverter 168 [SN74185] has its ABCDE select inputs connected to five outputs of inverter drivers 167. The sixth output of inverter drivers 167 is the $2^0$ part of the binary output information and is not connected to converter 168 as is well known for a binary-to-BCD conversion. That output instead provides the binary A bit of the ABCD bits of the least significant decade to a line 169. Three of the outputs of converter 168 provide the binary BCD bits of this least significant decade to lines 170, 171 and 172, respectively. The other two outputs of converter 168 provides the binary A and B bits of the most significant decade to lines 173 and 174, respectively. The lines 169 through 172 provide the 1, 2, 4 and 8 BCD units of the decimal number corresponding to the signals for the computer provided in four of the signal sources 165. Lines 173 and 174 provide signals via the other two of signal sources 165 when the computer initiates a scanning of the 11th through 20th counter means or the 21st through 30th counter means, respectively.

As seen below, the construction of the second embodiment of the system is such that any one of the first ten counter means is interrogated as a result of the selected voltage levels in lines 169 through 172 representing the ABCD bits of the least significant decade. In this case, neither line 173 nor line 174 has the proper signal to provide a "1" or a "2" at lamp 157. For this reason to interrogate the first counter means the lines 169 through 174 have signals corresponding to the number "00" that is herein called channel signal 00 shown at the bottom left-hand portion of FIG. 6 as "CH00" that enables register 1 gate (FIG. 2). The other nine of the first ten counter means have their register gate means controlled by channel signals in lines 169-172. For example, the tenth counter means has its BCD entered when register 10 gate is enabled by CH09 signal.

When the A or B bit output of the most significant decade also provides a signal by line 173 or line 174, one of the second or third set of ten counter means is to be read. The channel signal is dependent in each case also on the voltage levels in lines 169 through 172. For example, to read the 14th counter means a channel signal CH13 is provided by signals in lines 173 and lines 169 and 170, and to read the 25th counter means a channel signal CH24 is provided by signals in line 174 and line 171. Thus the thirty counter means are identified as counter means "00" through counter means "29".

The counter means "00" being the first counter, is hereinafter referred to as register 1 BCD counter means. The others are referred to in a corresponding manner. Similarly channel signal "CH00" is that at register 1 gate and the others are similarly signals for other register gate means. Thus the signal "CH29" is that at register 30 gate. The thirty channel pulses, identified as CH00 through CH29, are shown at the bottom of FIG. 6.

The second embodiment of the system of the invention, as illustrated by FIGS. 5 and 6, has thirty BCD counter means. Each of these has a set of four register BCD counters, namely, register units counter, register tens counter, register hundreds counter and register thousands counter. Connected to the BCD outputs of each of these four counters is a set of four register gates namely, register units, tens, hundreds and thousands gates, of a register gate means. The connections for each of the thirty counter means is in the manner shown for the first embodiment in the bottom half of FIG. 2. Each of four register gates of the set for each of the thirty sets of counter means has an input connected to a corresponding channel pulse for enabling that set when the corresponding counter means is to be read.

Each counter means has an input of its four register BCD counters that is connected to the same output of a positive-AND gate (like gate 71 in FIG. 2) that has two inputs. One input is connected to the corresponding channel signal and the other is connected to a register reset (like reset 67 in FIG. 2). The register reset is prevented from operation when that counter means is having its BCD count transferred to data latches 138 through 141 by a circuitry enabled when the computer is providing the readout. This lockout is provided by the corresponding channel signal produced by the computer selection.

Each of the thirty sets of register gate means connected at their inputs to the outputs of the four decades of the corresponding BCD counter means has its four sets of BCD outputs connected to the inputs of data latches 138 through 141. These sixteen outputs of each of the thirty sets of register gates are shown as signal sources in FIGS. 5 at latch 136 left margin where they are identified as "register gate output." Of course, there will be signals only from one of the thirty sets of register gates as a "register gate output" for a reading of one of the counter means.

A part of the circuitry as shown in FIG. 6 is similar to a part of the circuitry of the first embodiment that is shown in FIG. 3. For this reason a number of the components in FIG. 6 are assigned the same numbers as components in FIG. 3. In FIG. 6 there are register selector gates 91, 92, 103 and 104. There are also register selector gates 93 and 94. The BCD inputs of register selector gate 94 are connected by lines (not numbered) to the BCD outputs of register selector gates 92 and 104. Similarly, the BCD inputs of register selector gate 93 are connected by lines (not numbered) to the BCD outputs of gates 91 and 103. The BCD outputs of register selector gate 94 are connected by lines (not numbered) to the corresponding BCD inputs of BCD-to-decimal decoder 110. The BCD outputs of register selector gate 93 are connected by lines (not numbered) to the corresponding BCD inputs of BCD-to-decimal decoder 111. As in the case of the first embodiment, the BCD outputs of switch 64 are connected by lines (not numbered) to the corresponding BCD inputs of register selector means 91 and 92.

Because there are thirty counter means to be read, the second embodiment in FIG. 6 has another register selector gate 175 [SN7401] also having its BCD inputs connected by lines (not numbered) to the corresponding BCD outputs of switch 64. Also there is a register selector gate 176 [SN7401] that has its BCD inputs connected by lines (not numbered) to lines 169 through 172 that by lines (not numbered) are connected in the proper BCD manner also to the BCD inputs of register selector gates 103 and 104. The BCD outputs of gate 175 and those of gate 176 are connected by lines (not numbered) to the corresponding BCD inputs of a register selector gate 177 [SN7400] that has its BCD outputs connected by lines (not numbered) to an additional BCD-to-decimal decoder 178 [SN7442].

The system in FIG. 6 further includes additional register selector gates 179 and 180 [both SN7401]. Both of these have their BCD outputs connected by lines (not numbered) to the corresponding four BCD signal sources shown as register ID for the units part of the identifying decimal number and thus are connected to data latch 137 (FIG. 5). The BCD inputs of gate 179 are connected by lines (not numbered) to the corresponding BCD outputs of switch 64 while the BCD inputs of gate 180 are connected in a corresponding manner to lines 169 through 172.

The line 173 is connected to one input of the first NAND gate and line 174 is connected to one input of the second NAND gate of a decade selector 181 that is quadruple 2-input positive-NAND gates [SN7401]. The "10" output and the "20" output of switch 65 are connected to lines 182 and 183, respectively. The line 182 is connected to one input of the third NAND gate of decade selector 181 and line 183 is connected to one input of the fourth NAND gate of decade selector 181. The outputs of the first and third NAND gates of decade selector 181 are connected to a line 184 and the outputs of the second and fourth NAND gates of decade selector 181 are connected to a line 185. The lines 184 and 185 are connected to the two inputs of a NAND gate of a decade selector 186 that can be quadruple 2-input positive-NAND gates [SN7401]. The output of that NAND gate is connected by a line 187 to an inverter 187' that has its output connected to another input of register selector gate 94.

A line 188 is connected to line 184 and a line 189 is connected to line 185.

The line 188 is connected to a line 188' that provides the "BCD 10" signal source of register ID to the "10" input of data latch 136. The line 189 is connected to a line 189' that provides the "BCD 20" signal source of register ID to the "20" input of data latch 136.

The line 188 is connected by a line 190 to an inverter 190' that has its output connected to another input of register selector gate 93 so that gate 93 is enabled when the "10" signal is entered into data latch 136. Similarly, line 189 is connected by a line 191 to an inverter 191' that has its output connected to another input of register selector gate 177 to enable it whenever a "20" signal is entered into latch 136.

Each of decoders 110, 111 and 178 has ten outputs. Each of these ten outputs is connected to two 5-counter PCB cards as shown at the bottom portion of FIG. 6. For the illustrative system using thirty counter means it is seen that there are six 5-counter PCB cards. Each card has hex inverter drivers [SN7405]. Five of these inverters of each card are used as seen in FIG. 6. The inputs of these five inverters are connected by lines (not numbered) to five of the outputs of each decoder. For example, decoder 110 has its ten outputs connected to five hex inverters of each of two cards.

Each card has five counter means, i.e., five 4-decade register BCD counters (each like counter 25). The sixteen BCD outputs of each counter means are connected (like the connections shown in FIG. 2 for the first embodiment) to the corresponding sixteen BCD inputs of one of the five sets of four register gates [SN7401N] of the twenty register gates that are also on the card. Each of these sets, of course, includes a register units gate, a register tens gate, a register hundreds gate and a register thousands gate. Each card has five signal sources provided by the outputs of the five inverters. For the first card that contains the first five means, these signal sources are essentially the register 1 gate through the register 5 gate but, for reasons explained above, they are identified as signal sources CH00 through CH04. For each card these five signal sources are connected to inputs of the sets of register gates so that each will, when provided with a signal, enable the four register gates of a set providing at their outputs the BCD data accumulated in the associated counter means. These outputs of all of the thirty sets of register gates are connected to the BCD inputs of data latches 138–141, as they constitute the register gate output indicated in FIG. 5. Of course, only one set of gates is enabled for one reading so that the data entering these latches at that time constitutes the BCD data in the counter means being read.

A device select signal 193 is provided via the driver line portion of the computer communications bus to the system when signals are provided as signal sources 165 by the computer. The signal 193 provides, by an optical isolator 195, an input to an inverter 196 of hex inverter drivers generally indicated at 197. The inverted output signal of inverter 196 is provided to a line 198 that is connected by lines (not numbered) to inputs of register selector gates 104, 103 and 176. The inverted output signal of inverter 196 is also an input to an inverter 199 of inverter drivers 197. The output of inverter 199 is connected to a line 200 that is connected by lines (not numbered) to inputs of register selector gates 92, 91 and 175.

The line 198 is connected to a line 198' that is connected to the second input of the first NAND gate and to the second input of the second NAND gate of decade selector 181. The line 200 is connected to a line 200' that is connected to the second input of the third NAND gate and the second input of the fourth NAND gate of decade selector 181.

By the foregoing construction, gate 94 is disabled whenever there is a signal in line 184 or line 185, from decade selector 181, indicating that the computer or the manual display selector is selecting for a reading of one of the second set or one of the third set of the 30 counter means. When the computer is selecting for a reading of one of said second set or one of said third set of counter means, an input signal to the decade selector 181 occurs on line 173 or line 174, respectively, and an input signal is in line 200' as the result of device select signal 193. In addition to disabling gate 94, and thus the first set of the three sets of counter means, the voltage level in line 200' is now such that neither input signal to decade selector 181 from switch 65, even though switch 65 is set to provide one of these signals to decade selector 181, can provide an output signal from decade selector 181 to enable gate 93 or gate 177. Thus, the setting of switch 65 has no effect on the enabling of gate 93 or gate 177 during the computer reading by signal 193 and a signal in line 173 or line 174. However, when there is no signal 193 from the computer, decade selector 181 has an output signal on line 184 or line 185 due to the signal in line 182 or line 183 from the setting of switch 65 and the signal in line 200' from inverter 199, thus enabling gate 93 or gate 177 for local readout.

When a device select signal is provided as signal source 193, there is a signal in line 198 that enables gates 104, 103 and 176. Thus inverter 196 is a part of computer register selector 21. Other components of the second embodiment that provide selector 21 include inverter drivers 167, converter 168, decade selector 181, register gates 104, 103 and 176, register gates 94, 93 and 177 and decoders 110, 111 and 178.

The device select signal 193 provides from inverter 199 of hex inverter drivers 197 a signal to line 200 that disables register selector gates 92, 91 and 175. Thus inverter drivers 197 provides computer-operated lockout 22 that disables manual display selector 53 so that, during a computer reading, selector 53 is locked out by the disabling of gates 92, 91 and 175. The switches 64 and 65 of switch means 63, gates 92, 91 and 175, register selector gates 94; 93 and 177, decoders 110, 111 and 174, and decade selector 181 comprise manual display selector 53. It is seen that some of these components are used for selector 21 as well as for selector 53.

In the second embodiment of the system shown in FIGS. 5 and 6, data latches 135 are used in place of data latch 52 and shift register 16 (FIG. 1) of the first embodiment. Accordingly, in the second embodiment there is no lockout of data latches provided by computer-lockout 22.

The line 198 is connected to a line (not numbered) that is connected to an input of gate 180 so that when device select signal 193 is provided by the computer, gate 180 is enabled to transfer BCD data from lines 169–172, as signals of the register ID to data latch 137. The line 200 is connected to a line (not numbered) that is connected to an input of gate 179. As a result, when there is a signal 193, gate 179 is disabled so that the BCD information in switch 64 is not entered by gate 179 into data latch 137.

When there is a computer reading, even though switch 65 has been manually set to select for a local readout of one of the second or third sets of ten counter means, there is a lockout of the local selection by switch 65 of one of those counter means. At the time of a computer readout the only BCD inputs to gate 93 or gate 177 would be based on the signals in lines 169–172 to gate 103 and gate 176 that are enabled by a signal in line 198 based on device select signal 193. Only one of gates 93 and 177 is enabled. The gate that is enabled is dependent on whether there is a signal in line 184 or line 185 from decade selector 181 and that depends on whether there is a signal in line 173 or line 174.

A line 201 is connected to line 198 so that it receives a signal 202 when the computer provides a device select signal 193. The signal 202 is identified as "computer device select" signal, in the right-hand end of the central portion of FIG. 6 and at the bottom right-hand corner of FIG. 5. The signal 202 is provided by a line 203 (FIG. 5) and branch lines (not numbered), connected to line 203, to computer input gate means 142 so that gates 143–146 are enabled when device select signal 193 is provided by the computer.

As seen in FIG. 5, a signal 205, that is provided by the computer using one of the command lines of the communications bus, is identified as "computer execute". The signal has an input to an optically-coupled isolator 206 (TIL 112) to provide thereby a signal in a line 207 that is connected to an input of a positive-NAND gate 208. The line 207 is also connected to the clear input of a retriggerable monostable multivibrator 209 [SN74123] that, when triggered, conditions the signal to provide a Q output signal to a line 210 that is connected to the other input of gate 208. When lines 207 and 210 provide these signals to the two inputs, the pulse at the output of gate 208 is provided by a line 211 and branch lines (not numbered), connected to line 211, to inputs of data latches 136–141, whereby they are enabled, so that the register gate output and register ID are entered into these latches, based on this computer selection of BCD counter means to be read. This computer execute pulse 205 is provided very shortly after the computer provides binary information signals 165 and device select signal 193 to select the counter means corresponding to the binary information from the computer by enabling gate 94 or 93 or 177 and gate 104 or 103 or 176, respectively, and thereby to enable the set of register BCD gates connected to that counter means. Because the computer input gate means 142 has its four gates 143–146 now enabled, the BCD data of that counter means is transmitted from latches 138–141 to the computer by the sixteen address lines shown at the right-hand side of FIG. 5. The computer internally enters the binary information identifying the counter means that is being read and recorded.

When line 207 provides a signal to multivibrator 209 for a Q output of it by line 210 a signal is also provided to a line 212 connected to line 210. The line 212 is connected to the clear input of a retriggerable monostable multivibrator 213 [SN74123] to produce a signal, after a delay, at its Q output to a line 214 that is connected to another optically-coupled isolator 215 [TIL 112]. When this occurs the isolator 215 provides a signal 216 to the computer that the readout of that counter means is completed. The signal 216 is identified as "system on-line feedback" in FIG. 5.

As seen from the foregoing description of the second embodiment of the system, as shown in FIGS. 5 and 6, the computer can randomly select the BCD information accumulated in any BCD counter means and is not limited to, i.e., locked into, a sequential scanning mode, as is the case for the first embodiment. The random selection of the second embodiment is possible primarily due to the presence in the system, as shown in FIG. 6, of binary-to-BCD converter 168 that provides a set of BCD signals based on a set of binary signals at the same time from the computer. The sequential scanning of the first embodiment is required because of the presence in the system, as shown in FIG. 3, of decade counter 102 that provides a set of BCD signals based on the accumulation in the counter of pulses from the computer, with one pulse being provided for each computer readout. In that construction the sequence is fixed after all components have been suitably connected.

In the specified preferred aspect of the second embodiment of the system shown in FIGS. 5 and 6 the system uses printed circuit cards for the BCD counter means and the sets of register gates associated with them. Each card illustratively contains five of these counter means and their associated sets of register gates. The system of the first embodiment in an especially preferred aspect can also use such modules of counter cards. This modularity of counter cards permits tailoring the system of the first embodiment or the system of the second embodiment for the specific number of counting jobs required by a given application and thus minimizes the cost of the system.

Because of the presence of data latches 138–141 and associated components instead of shift register 16 and associated components, the second embodiment of the system is more useful than the first embodiment for the usual computer interfacing. This is because the second embodiment in view of this difference of storage means permits parallel transfer of information for each computer readout of a BCD counter means. This type of transfer provides an appreciably higher communication rate.

The description of two preferred embodiments of the invention has described specific optical displays as local digital readout 62 in combinations with specific decoders 61. As mentioned earlier, the information in the storage means, that has been transferred from any of the BCD counter means by enabling the associated set of gate means, can be transferred for a local digital readout that is a printout display in another embodiment of the invention. In that embodiment typewriter means, that includes decoder means, changes BCD information transferred from the storage means to decimal digital information and types out this decimal digital information. In this embodiment of the invention there is a local printing of the accumulated count of a BCD counter means and, of course, it can be read locally, in lieu of or in addition to the optical display described above in the first and second embodiments.

As seen by the foregoing description, the system of the present invention includes signal-responsive means having a construction that not only enables selectively one of the set of gate means but also generates BCD signals corresponding to the decimal number assigned to the BCD counter means to be read. Thus the system for a local readout includes components that can locally display, either optically or by a printout, the decimal number assigned to the BCD counter means being read. That number is based on the generated BCD signals. The number is displayed with the accumulated count in the BCD counter means being read. In the illustrative embodiments the signals providing digital information to the signal-responsive means for its generation of BCD signals are provided by the setting of BCD switch means 63. Of course a necessary part of the signal-responsive means includes the decade selector 95 (FIG. 3) or 181 (FIG. 6). This construction of the system provides a substantial advantage over a manual readout that would be based on a system with a number of switches corresponding to the number of counter means. In that construction there would be no local readout of the number assigned to the counter means that is being read by operating the particular switch associated with that counter means. For the readout of that system it would be necessary to double check the switch so as to be sure that the value of the count printed or optically displayed is the count in the BCD counter means intended to be read. Because of the automatic printout or display by the present system of the number assigned to the BCD counter means being read, a double check is unnecessary. Of course, for the printout the BCD counter means is advantageously identified along side of the printout of the accumulated count.

The foregoing description has been presented solely for the purpose of illustration and not by way of limitation of the invention because the latter is limited only by the claims that follow.

We claim:

1. A multi-counter register system, useful for reading individual accumulated counts in a set of BCD counter means at a local area by local readout means at the local area or by a computer located at a remote area and using a communications bus connecting the multi-counter register system at the local area and the computer, which comprises:

sets of gate means, each set of gate means having:
at least one set of four outputs to provide a BCD signal from said set of gate means; and
at least one set of four inputs to receive a BCD signal at said set of inputs, said one set of four inputs of each of said sets of gate means being connectable to a different BCD counter means of a set of BCD counter means;

data storage means having:
at least one set of four data inputs to receive digital information as a BCD signal, said one set of four data inputs being connected to each of said one set of four outputs of said sets of gate means;
at least one set of four other inputs to receive a BCD signal corresponding to the decimal number assigned to the BCD counter means that is connectable to said one set of said sets of gate means; and
at least one set of outputs to transmit at the same time digital information as a BCD signal based on the digital information received at one of said sets of four inputs of said storage means;

means to provide different BCD signals at four outputs, each of said different BCD signals corresponding to the decimal number assigned to a different one of the BCD counter means that are connectable to different said one sets of said four inputs of said sets of gate means, said one set of four outputs of said BCD signal-providing means being connected to said one set of four other inputs of said data storage means; and means responsive to BCD signals, said signal-responsive means having BCD inputs connected to said four outputs of said BCD signal-providing means and having a number of outputs each connected to an enable input of a different set of said sets of gate means, said signal-responsive means providing a signal at a different one of said number of outputs, for different BCD signals at said inputs of said signal-responsive means provided by said signal-providing means, to enable selectively one of said set of gate means so that the BCD counter means connected to that enabled set of gate means is operatively connected to said one set of four data inputs of said data storage means for transfer of digital information from that BCD counter means to said storage means.

2. The system of claim 1 and further including:
a set of BCD counter means, each having BCD outputs that are connected to said inputs of said sets of gate means so that each set of gate means is thereby connected to a different one of said counter means.

3. The system of claim 2 wherein:
each of said set of BCD counter means is a multi-decade counter having BCD outputs for each decade;
each set of gate means connected to each counter means comprises a number of gates corresponding to the number of decades of each of said multi-decade counters, each of said number of gates having BCD inputs connected to the BCD outputs of a different one of the decade counters and having BCD outputs connected to said data storage means; and
said data storage means has sets of four data inputs, including said one set of four data inputs, corresponding in number to the number of decades of that multi-decade counter of said multi-decade counters having the maximum number of decades, each of said set of four data inputs being connected to each of said number of gates of each set of gate means so that each set of four data inputs is connected to the four outputs of those gates of all of said sets of gate means corresponding to the same decade.

4. The system of claim 3 wherein said signal-responsive means connected to said sets of gate means comprises:
selector gate means responsive to one of said signals to be enabled and having BCD inputs and BCD outputs;
BCD-to-decimal decoder means having BCD inputs, connected to said BCD outputs of said selector gate means, and having decimal outputs, each decimal output being connected to an enable input of a different set of said sets of gate means, whereby one of said sets of gate means is enabled by a signal in one of said decimal outputs of said decoder means,
said BCD signal-providing means being connected to said BCD inputs of said selector gate means to provide said selector gate means said BCD signals corresponding to the decimal number assigned to the BCD counter means selected to be read.

5. The system of claim 4 wherein:
there are more than a decade of BCD counter means;
said sets of gate means correspond in number to the number of BCD counter means;
said BCD signal-providing means having said outputs to provide BCD signals corresponding to the least significant decade of the decimal number assigned to the counter means to be read has a construction to provide at another output a signal when the BCD counter means to be read is other than the first decade of BCD counter means;
said selector gate means has a first selector gate and a second selector gate, each of said first and second selector gates having BCD inputs connected to said BCD outputs of said BCD signal-providing means, and having BCD outputs;
said BCD-to-decimal decoder means has:
a first BCD-to-decimal decoder with BCD inputs connected to said BCD outputs of said first selector gate and with decimal outputs, each decimal output being connected to an enable input of a different one of the first decade of said sets of gate means; and
a second BCD-to-decimal decoder with BCD inputs connected to said BCD outputs of said second selector gate and with decimal outputs, at least one of these decimal outputs being connected to an enable input of a different one of said sets of gate means of those constituting at least a part of another decade of said sets of gate means; and
decade selector means responsive to said signal provided by said another output of said BCD signal-generating means that is obtained when the BCD counter means to be read is other than one of the first decade of counter means, said decade selector means having an input connected to said another output of said BCD signal-providing means, and having outputs connected to inputs of said first and second selector gates to enable alternatively either said first selector gate or said second selector gate dependent upon whether there is said signal provided at said another output of said BCD signal-generating means.

6. A multi-counter register system, useful for reading individual accumulated counts in a set of BCD counter means at least by a computer located at a remote area and using a communications bus connecting the multi-counter register system at a local area and the computer, which comprises:
sets of gate means, each set of gate means having:
at least one set of four outputs to provide a BCD signal from said set of gate means; and
at least one set of four inputs to receive a BCD signal at said set of inputs, said one set of four inputs of each of said sets of gate means being connectable to a different BCD counter means of a set of BCD counter means;
data storage means having:
at least one set of four data inputs to receive digital information as a BCD signal, said one set of four data inputs being connected to each of said one set of four outputs of said sets of gate means; and
at least one set of outputs to transmit at the same time digital information as a BCD signal based on the digital information received at said set of four data inputs of said storage means;
means to provide different BCD signals at four outputs, based on signals from the computer, each of said different BCD signals corresponding to the decimal number assigned to a different one of the BCD counter means that are connectable to different said one sets of said four inputs of said sets of gate means;
means responsive to BCD signals, said signal-responsive means having BCD inputs connected to said four outputs of said BCD signal-providing means and having a number of outputs each connected to an enable input of a different set of said sets of gate means, said signal-responsive means providing a signal at a different one of said number of outputs, for different BCD signals at said inputs of said signal-responsive means provided by said signal-providing means, to enable selectively one of said set of gate means so that the BCD counter means connected to that enabled set of gate means is operatively connected to said one set of four data inputs of said data storage means for transfer of digital information from that BCD counter means to said storage means;
means to provide at least one signal from the computer to another input of said storage means so that it can be loaded at said inputs connected to said sets of gate means with the digital information in that BCD counter means connected to that set of gate means enabled by said signal-responsive means, said means to provide at least one signal from the computer being operatively connected to said another input of said storage means; and
means connected to said outputs of said data storage means and responsive to at least one signal from the computer to transfer digital information from said storage means after each time that said storage means has received digital information from one of the set of BCD counter means by the enabling of that set of gate means associated with that counter means.

7. The system of claim 6 wherein said signal-responsive means connected to said sets of gate means comprises:
selector gate means responsive to one of said signals to be enabled and having BCD inputs and BCD outputs;
BCD-to-decimal decoder means having BCD inputs, connected to said BCD outputs of said selector gate means, and having decimal outputs, each decimal output being connected to an enable input of a different set of said sets of gate means, whereby one of said sets of gate means is enabled by a signal in one of said decimal outputs of said decoder means,
said BCD signal-providing means being outputs connected to said BCD inputs of said selector gate means to provide said selector gate means with said BCD signals corresponding to the decimal number assigned to the BCD counter means selected to be read.

8. The system of claim 7 and further including:
a set of BCD counter means, each having BCD outputs that are connected to said inputs of said sets of gate means so that each set of gate means is thereby connected to a different one of said counter means.

9. The system of claim 8 wherein:
each of said set of BCD counter means is a multi-decade counter having BCD outputs for each decade;
each set of gate means connected to each counter means comprises a number of gates corresponding to the number of decades of each of said multi-decade counters, each of said number of gates having BCD inputs connected to the BCD outputs of a different one of the decade counters and having BCD outputs connected to said data storage means; and
said data storage means has sets of four data inputs, including said one set of four data inputs, corresponding in number to the number of decades of that multi-decade counter of said multi-decade counters having the maximum number of decades, each of said set of four data inputs being connected to each of said number of gates of each set of gate means so that each set of four data inputs is connected to the four outputs of those gates of all of said sets of gate means corresponding to the same decade.

10. A multicounter register system, useful for reading individual accumulated counts in a set of BCD counter means at a local area by local readout means at the local area and by a computer located at a remote area and using a communications bus connecting the multicounter register system at the local area and the computer, which comprises:
sets of gate means, each set of gate means having:
at least one set of four outputs to provide a BCD signal from said set of gate means; and
at least one set of four inputs to receive a BCD signal at said set of inputs, said one set of four inputs of each of said sets of gate means being connectable to a different BCD counter means of a set of BCD counter means;
data storage means having:
at least one set of four data inputs to receive digital information as a BCD signal, said one set of four data inputs being connected to each of said one set of four outputs of said sets of gate means;
at least one set of four other inputs to receive a BCD signal corresponding to the decimal number assigned to the BCD counter means that is connectable to said one set of said sets of gate means; and
at least one set of outputs to transmit at the same time digital information as a BCD signal based on the digital information received at said one set of said sets of four inputs of said storage means;
means to provide different BCD signals at four outputs, based on signals from the computer, each of said different BCD signals corresponding to the decimal number assigned to a different one of the BCD counter means that are connectable to different said one sets of said four inputs of said sets of gate means;
means responsive to BCD signals, said signal-responsive means having BCD inputs connected to said four outputs of said BCD signal-providing means and having a number of outputs each connected to an enable input of a different set of said sets of gate means, said signal-responsive means providing a signal at a different one of said number of outputs, for different BCD signals at said inputs of said signal-responsive means provided by said signal-providing means, to enable selectively one of said set of gate means so that the BCD counter means connected to that enabled set of gate means is operatively connected to said one set of four data inputs of said data storage means for transfer of digital information from that BCD counter means to said storage means;
means to provide at least one signal from the computer to another input of said storage means so that it can be loaded at said inputs connected to said sets of gate means with the digital information in that BCD counter means connected to that set of gate means enabled by said signalresponsive means, said means to provide at least one signal from the computer being operatively connected to said another input of said storage means;
means connected to said outputs of said data storage means and responsive to at least one signal from the computer to transfer digital information from said storage means after each time that said storage means has received digital information from one of the set of BCD counter means by the enabling of that set of gate means associated with that counter means;
data display means at the local area of said system to provide a visual display of a number of decimal digits;
display decoder means comprising a set of display decoders that for each have BCD inputs and at least one output connected to said data display means;
data latch means comprising a set of display latches, each having BCD outputs connected to said BCD inputs of different display decoders of said display decoder means, and each having BCD inputs connected in parallel to said outputs of said sets of gate means;
manually-settable means connected to said sets of gate means to enable selectively one of said sets of gate means for transfer to said display latch means the digital information from that BCD counter means connected to that enabled set of gate means; and
means responsive to a signal from the computer to provide a signal to lockout the enabling operation of said manually-settable means, said lockout means being connected to said manually-settable means to provide this lockout during the reading of at least one of said set of counter means by the operation of the signal-responsive means that enables, by signals by the computer, each time a set of gates, by the operation of the means that loads each time the BCD information into said storage means from that counter means connected to the enabled set of gate means, and by the operation of said means responsive to the signal from the computer that enables the transfer of information from said storage means to the computer,
said signal-responsive means connected to said sets of gate means comprising:
selector gate means responsive to one of said signals from the computer to be enabled and having BCD inputs and BCD outputs;
BCD-to-decimal decoder means having BCD inputs, connected to said BCD outputs of said selector gate means, and having decimal outputs, each decimal output being connected to an enable input of a different set of said sets of gate means, whereby one of said sets of gate means is enabled by a signal in one of said decimal outputs of said decoder means, said BCD signal-providing means being connected to said BCD inputs of said selector gate means to provide said selector gate means with said BCD signals corresponding to the decimal number assigned to the BCD counter means selected to be read.

11. The system of claim 10 wherein said lockout means is connected to said set of display latches to disable said display latches when said lockout means provides a signal to lockout the enabling operation of said manually-settable means.

12. The system of claim 11 and further including a set of means to reset individually each of said set of counter means, each reset means being connected to a different counter means and constructed to be rendered inoperative by a signal from said means responsive to signals from the computer that provides a signal to enable said set of gate means connected to that counter means connected to said reset means.

13. The system of claim 10 and further including a set of means to reset individually each of said set of counter means, each reset means being connected to a different counter means and constructed to be rendered inoperative by a signal from said means responsive to signals from the computer that provides a signal to enable said set of gate means connected to that counter means connected to said reset means.

14. The system of claim 10 wherein:
said manually-settable means comprises:
BCD switch means including a BCD switch that is manuallysettable and that has BCD outputs that provide a specific combination of signals dependent upon the manual setting of said BCD switch to correspond to the least significant decade of the decimal number assigned to the counter means to be locally read in accordance with the setting of the switch means;
second selector gate means having an input to disable said second selector gate means in response to a signal from said lockout means, having BCD inputs that are connected to said BCD outputs of said BCD switch, and having BCD outputs; and
BCD-to-decimal decoder means having BCD inputs connected to said BCD outputs of said second selector gate means and with decimal outputs that are connected to an enabling input of different set of gate means of said sets of gate means,
said lockout means being connected to said manually-settable means by being connected to an input of said second selector gate means to disable that gate means when said first selector gate means is enabled;
said data display means further provides a visual display of a decimal digit based on a BCD signal from said BCD outputs of said BCD switch;
said display decoder means includes another display decoder that has BCD inputs and has at least one output connected to said data display means for display of said decimal digit; and
said data latch means includes a display latch having BCD outputs connected to said BCD inputs of said another display decoder, and having BCD inputs connected to said BCD outputs of said BCD switch.

15. The system of claim 14 wherein:
said data display means comprises a set of lamps or the like that provide an optical display of decimal digits, some of the lamps providing this optical display of the accumulated count in the BCD counter means being read and one of the lamps providing this optical display of the least significant decade of the decimal number assigned to that BCD counter means.

16. The system of claim 10 and further including:
a set of more than a decade of BCD counter means, each being a multi-decade counter having BCD outputs for each decade, and
wherein:
each set of gate means connected to each counter means comprises a number of gates corresponding to the number of decades of each of said multi-decade counters, each of said number of gates having BCD inputs connected to the BCD outputs of a different one of the decade counters and having BCD outputs connected to said data storage means, said set of gate means corresponding in number to the number of BCD counter means;
said means responsive to signals from the computer is constructed to provide, based on those signals, BCD signals, at its BCD outputs, corresponding to the least significant decade of the decimal number assigned to the counter means to be read;
said first selector gate means includes:
a first selector gate and a second selector gate, each of said first and second selector gates having BCD inputs and BCD outputs, said inputs being connected to said BCD outputs of said signal-responsive means that provides said BCD signals corresponding to said least significant decade; and
decade selector means responsive to signals from the computer and connected to inputs of said first and second selector gates to enable, alternatively, either said first selector gate or said second selector gate;
said manually-settable switch means comprises:
a first BCD switch and a second BCD switch, said first BCD switch having BCD outputs that provide a specific combination of signals dependent upon the manual setting of said first BCD switch to correspond to the least significant decade of the decimal number assigned to the counter means to be locally read in accordance with the setting of the switch means and said second BCD switch having BCD outputs that provide a specific combination of signals dependent upon the manual setting of said second BCD switch to correspond to the next significant decade of said decimal number, at least the lowest significant digit of said BCD output of said second BCD switch being connected to an input of said decade selector means, said second BCD switch being operative on said decade selector means to enable alternatively, either said first selector gates or said second selector gates for a local readout; and
second selector gate means comprising a third selector gate and a fourth selector gate, each having an input to disable these gates in response to a signal from said lockout means, each having BCD inputs that are connected to said BCD outputs of said first BCD switch and each having BCD outputs, said third selector gate having its BCD outputs connected to said BCD input of said first selector gate and said fourth selector gate having its BCD outputs connected to said BCD inputs of said second selector gate, and both of said disable inputs being connected to said lockout means;

said BCD-to-decimal decoder means having:
- a first BCD-to-decimal decoder with BCD inputs connected to said BCD outputs of said first selector gate and with decimal outputs, each decimal output being connected to an enable input of a different one of the first decade of said sets of gate means; and
- a second BCD-to-decimal decoder with BCD inputs connected to said BCD outputs of said second selector gate and with decimal outputs, at least one of these decimal outputs being connected to an enable input of a different one of said sets of gate means of those constituting at least a part of another decade of said sets of gate means.

said first and second selector gates having their BCD inputs connected to said BCD outputs of said signal-responsive means by connection to BCD outputs of a fifth selector gate and a sixth selector gate, respectively, having their BCD inputs connected to said BCD output of said signal-responsive means, said fifth and sixth selector gates each having an enable input connected to said lockout means that provides an enable signal to said fifth and sixth selector gates when said lockout means provides lockout signals to said third and fourth selector gates;

said data display means includes:
- one display device for a visual display of a decimal digit based on a BCD signal from said BCD output of said first BCD switch, said decimal digit being the least significant decade of the decimal number representing the setting of said switch means for a specific local readout; and
- another display device for a visual display of a decimal digit based on a BCD signal from said BCD outputs of said second BCD switch, said second decimal digit being the next significant decade of the decimal number representing the setting of said switch means for a specific local readout;

said display decoder means includes two other display decoders, one of said other decoders having at least one output connected to said one display device, and the second of said other display decoders having at least one output connected to said another display device;

said data latch means includes two display latches that have their BCD outputs connected to said BCD inputs of said one and said another display devices, one of said two display latches having BCD inputs connected to said first BCD switch and the other of said two display latches having at least one of its BCD inputs connected to said second BCD switch; and said lockout means is connected to said data latch means to prevent loading of said data display means during a computer readout.

17. The system of claim 16 wherein said other display latch of said two display latches is connected to said second BCD switch by being connected to said decade selector means.

18. A multi-counter register system, useful for reading individual accumulated counts in a set of more than a decade of BCD multi-decade counter means at least by a computer located at a remote area and using a communications bus connecting the multi-counter register system at a local area and the computer, which comprises:

data storage means comprising first, second, third and fourth shift registers for storage of 8's bits, 4's bits, 2's bits and 1'bits, respectively, of BCD signals, each shift register having at least a number of bits corresponding to the total of the number of decades of any of the BCD multi-decade counter means and the number of digits of the decimal number of counter means of the set to be read, each bit having an input, and each of said shift registers having an input that, when signalled, permits a parallel loading of said shift registers, having an input that, when signalled, provides a shift of all of said shift registers and having an output to transfer data by the communications bus to the computer;

sets of gate means, the number of sets corresponding to the number of counter means to be read, each set of gate means comprising a number of gates corresponding in number to the number of decades of any of said counter means, each gate having BCD inputs, BCD outputs and an enable input, and each gate of each set of gates having each of said BCD outputs connected to different bit inputs of said first, second, third and fourth shift registers to provide a parallel loading of BCD data from an enabled set of gates;

a decade counter having BCD outputs, having an input to receive from the computer pulse signals to be counted and thereby to change the BCD signal at said outputs as digital information corresponding to the decimal number assigned to the counter means to be read after each pulse is received from the computer, having another input to set said decade counter to zero by a pulse signal from the computer, and having another output that provides a clock signal when said decade counter has counted ten pulses from the computer;

first and second selector gates, each having an input, BCD outputs, and BCD inputs connected to said BCD outputs of said decade counter;

decade selector means comprising a flip-flop having a first output connected to said one input of said first selector gate, having a second output connected to said one input of said second selector gate, and having an input connected to said output of said decade counter to provide by said clock signal a change of state of said outputs of said flip-flop so that said first selector gate initially enabled is no longer enabled and said second selector gate is then enabled;

a first BCD-to-decimal decoder with BCD inputs connected to said BCD outputs of said first selector gate and with decimal outputs, each decimal output being connected to an enable input of a different one of the first ten of said sets of gate means;

a second BCD-to-decimal decoder with BCD inputs connected to said BCD outputs of said second selector gate and with decimal outputs, at least one of these decimal outputs being connected to an enable input of a different one of said sets of gate means of those constituting at least a part of another decade of said sets of gate means; and signal-delay means having an input connected to a line that connects to said input of said decade counter to provide pulse signals from the computer to said decade counter, said signal delay means having an output connected to said input of each of said shift registers that permits their loading, whereby, each time a pulse is counted by said decade counter, said shift registers, after a delay, have BCD information loaded into them from one of the BCD counter means through the set of gate means that is enabled.

19. The system of claim 18 and further including for a local digital readout of accumulated count in any of the set of counter means selected manually:

data display means at the local area of said system to provide a visual display of a number of decimal digits that are the decimal number assigned to the BCD counter means being read and the accumulated count in that counter means;

display decoder means comprising a set of display decoders equal in number to the maximum number of decimal digits to be displayed by said data display means, each display decoder having at least one output connected to said data display means, and having BCD inputs;

data latch means comprising a number of display latches corresponding in number to the number of display decoders, each having BCD outputs connected to said BCD inputs of different display decoders of said display decoder means and some of said display latches having BCD inputs connected in parallel to said outputs of said sets of gate means;

manually-settable switch means to enable selectively one of said sets of gate means for transfer to said display latch means the digital information from that BCD counter means connected to that enabled set of gate means, said manually-settable means comprising:

a first BCD switch and a second BCD switch, said first BCD switch having BCD outputs that provide a specific combination of signals dependent upon the manual setting of said first BCD switch to correspond to decimal digit of the least significant decade of the decimal number assigned to the counter means to be locally read in accordance with the setting of the switch means, and said second BCD switch having BCD outputs that provide a specific combination of signals dependent upon the manual setting of said second BCD switch to correspond to decimal digit of the next significant decade of said decimal number, the output for the lowest significant digit of said BCD outputs of said second BCD switch being connected to another input of said flip-flop of said decade selector means, whereby said second BCD switch when set to provide a signal at that output for the lowest significant digit for a local readout can have said flip-flop at the state in which its outputs enable said second selector gate and disable said first selector gate, said first BCD switch having its BCD outputs connected to the BCD inputs of one of the other of said display latches and said second BCD switch having its output for its lowest significant digit connected to the corresponding input of the BCD inputs of another of said other display latches, second selector gate means comprising a third selector gate and a fourth selector gate, each having an input to enable these gates when signalled, each having BCD inputs that are connected to said BCD outputs of said first BCD switch, and each having BCD outputs, said third selector gate having its BCD outputs connected to said BCD inputs of said first selector gate and said fourth selector gate having its BCD outputs connected to said BCD inputs of said second selector gate;

a fifth selector gate having BCD inputs connected to said BCD outputs of said decade counter, having BCD outputs connected to said BCD inputs of said first selector gate to provide said connections between said decade counter and said first selector gate, and having an input to enable, when signalled, said fifth selector gate; and a sixth selector gate having BCD inputs connected to said BCD outputs of said decade counter, having BCD outputs connected to said BCD inputs of said second selector gate to provide said connections between said decade counter and said second selector gate, and having an input to enable, when signalled, said sixth selector gate;

means responsive to a signal to said decade counter from the computer to provide a signal to lockout the enabling operation of said manually-settable switch means, said lockout means comprising a second flip-flop having:

a first input to receive that signal to change the state of said second flip-flop;

two outputs, one of said outputs being connected to the said enable inputs of said third and fourth register gates and being connected through an inverter to said enable inputs of said fifth and sixth selector gates so that with said change of state of said second flip-flop by the signal for computer reading said fifth and sixth selector gates are enabled and said third and fourth selector gates are not longer enabled, said one output of said second flip-flop being connected to said second BCD switch to prevent its operation on said first flip-flop of said decade selector during the computer readout, and said other output of said second flip-flop being connected to said another input of said decade counter whereby the pulse from the computer, that changes the state of said second flip-flop, provides the signal to said decade counter to set it to zero; and a second input for a signal, from the computer when its readout is completed, to change the state of said second flip-flop, whereby said fifth and sixth selector gates are not longer enabled, said third and fourth selector gates are enabled and said second BCD switch can be operative on said first flip-flop.

20. The system of claim 19 wherein said data display means comprises a set of lamps or the like that provide an optical display of decimal digits, some of the lamps providing this optical display of the accumulated count in the BCD counter means being read and two lamps providing this optical display of the least significant decade and the next significant decade of the decimal number assigned to that BCD counter means, said system further including:

a set of more than a decade of BCD counter means having a number equal to the number of said sets of gate means.

21. A multi-counter register system, useful for reading individual accumulated counts in a set of more than a decade of BCD multi-decade counter means at least by a computer located at a remote area and using a communications bus connecting the multi-counter register system at a local area and the computer, which comprises:
  data storage means comprising data latch means that includes a number of BCD latches corresponding in number to the number of decades of any of the BCD multi-decade counter means to be read, each of said data latches having BCD inputs, BCD outputs and an enable input;
  sets of gate means, the number of sets corresponding to the number of counter means to be read, each set of gate means comprising a number of gates corresponding in number to the number of decades of any of said counter means, each gate having BCD inputs, BCD outputs and an enable input, and each gate of each set of gates having its said BCD outputs connected to the BCD inputs of the corresponding one of said number of latches to provide a parallel loading of BCD data from an enabled set of gates to said number of latches;
  binary-to-BCD converter means to receive from the computer binary input information signals corresponding to the decimal number assigned to the counter means to be read, said converter means including a binary-to-BCD converter, and having first BCD outputs to provide BCD signals of the least significant digit of the decimal number corresponding to the binary input information signals and having at least another output for the least significant bit of BCD signals of the next significant digit of that decimal number provided by the binary input information signals;
  first and second selector gates, each having an input, BCD outputs, and BCD inputs connected to said first BCD outputs of said binary-to-BCD converter means;
  means responsive to another signal, from the computer as another part of a selection of a counter means for a computer readout, to provide an output signal;
  decade selector means having a gate with a first input connected to said output of said means responsive to said another signal from the computer, with a second input connected to said another output of said binary-to-BCD converter means, and with an output connected to said input each of said first and second selector gates to provide a signal level, when there is the same kind of signal provided to both of said first and second decade selector inputs, to enable said second selector gate and to remove the enabling of said first selector gate and to provide another signal level, when said another output of said binary-to-BCD converter does not provide the same signal at the time that said signal is provided to said first input of said gate of said decade selector means whereby said first selector gate is enabled and said second selector gate is not enabled;
  a first BCD-to-decimal decoder with BCD inputs connected to said BCD outputs of said first selector gate and with decimal outputs, each decimal output being connected to an enable input of a different one of the first decade of said sets of gate means;
  a second BCD-to-decimal decoder with BCD inputs connected to said BCD outputs of said second selector gate and with decimal outputs, at least one of these decimal outputs being connected to an enable input of a different one of said sets of gate means of those constituting at least a part of another decade of said sets of gate means; and
  computer input gate means, at the local area, comprising a set of input BCD gates, each having an enable input, BCD inputs and BCD outputs, said input gates corresponding in number to said number of BCD latches, said enable inputs being connected to the output of said means responsive to said another signal from the computer, said BCD inputs of said input gates being connected to the corresponding data latches of said number of BCD latches, and means connected to said BCD outputs of said input gates to transfer in parallel the BCD data of each of said input gates to the communications bus.

22. The system of claim 21 and further including:
  means responsive to a signal from the computer for each readout that is subsequent to the signal to said means responsive to said another signal from the computer, said means having an output connected to said enable inputs of said number of data latches to provide a signal for loading of said latches with the BCD data in the counter means after its selection by the enabling of one set of gate means; and
  a signal-delay device having an input connected to said output of said means connected to said enable inputs of said latches and having an output to provide, after a delay, a signal, through the communications bus, to the computer that the selection and readout of one of the counter means have been completed.

23. The system of claim 22 and further including a set of more than a decade of BCD counter means having a number equal to the number of said sets of gate means.

24. The system of claim 23 in which there is a number of printed circuit boards, each board containing a number of said counter means and an equal number of said sets of gate means.

25. The system of claim 23 wherein there is at least part of a third decade of sets of gate means and a corresponding number of said counter means, said system further including:
  a third selector gate having an input, BCD outputs, and BCD inputs connected to said first BCD outputs of said first BCD outputs of said binary-to-BCD converter means,
  said decade selector means has a second gate with a first input connected to said output of said means responsive to said another signal from the computer, with a second input connected to an output of said BCD converter for the next significant bit of BCD signals of the next significant decade of that decimal number provided by the binary input information signals, and with an output connected to said input of said third selector gate to provide a signal level, when there is the same kind of signal provided to both of the said first and second inputs, to enable said third selector gate and to remove the enabling of said first selector gate and to provide another signal level, when said another output of said binary-to-BCD converter does not provide the same signal at the time that said signal is provided to said first input of said second gate of said decade selector means whereby said first selector gate is enabled and said third selector gate is not enabled; and a third BCD-to-decimal decoder with BCD inputs connected to said BCD outputs of said third selector gate and with decimal outputs, each decimal output being connected to an enable input of a different one of the third decade of said sets of gate means.

26. The system of claim 25 and further including for a local digital readout of accumulated count in any of the set of counter means selected manually:

data display means at the local area of said system to provide a visual display of a number of decimal digits that are the decimal number assigned to the BCD counter means being read and the accumulated count in that counter means;

display decoder means comprising a set of display decoders equal in number to the maximum number of decimal digits to be displayed by said data display means, each display decoder having at least one output connected to said data display means, and having BCD inputs;

first and second additional BCD latches for said data latch means, each of said number of BCD latches and said first and second additional BCD latches having BCD outputs connected to said BCD inputs of different display decoders of said display decoder means, said number of BCD latches having BCD inputs connected in parallel to said outputs of said sets of gate means, and said first and second additional BCD latches having BCD inputs;

manually-settable switch means to enable selectively one of said sets of gate means for transfer to said display latch means the digital information from that BCD counter means connected to that enabled set of gate means, said manually-settable switch means comprising:

a first BCD switch and a second BCD switch, said first BCD switch having BCD outputs that provide a specific combination of signals dependent upon the manual setting of said first BCD switch to correspond to the decimal digit of the least significant decade of the decimal number assigned to the counter means to be locally read in accordance with the setting of the switch means, and said second BCD switch having BCD outputs that provide a specific combination of signals dependent upon the manual setting of said second BCD switch to correspond to decimal digit of the next significant decade of said decimal number, the output for the least significant digit of said BCD outputs of said second BCD switch being connected to a first input of a third gate of said decade selector means and the output for the next significant digit of said BCD outputs of said second BCD switch being connected to a first input of a fourth gate of said decade selector means;

means, connected to said output of said means responsive to said another signal from the computer, to invert the signal of said output and having an output connected to second inputs of said third and fourth gates of said decade selector means; and fourth through eleventh selector gates, each having an input to enable, when signalled, that selector gate, BCD inputs and BCD outputs, wherein:

said fourth, fifth and sixth selector gates have their BCD inputs connected to said BCD outputs of said first BCD switch, and have their BCD outputs connected to said BCD inputs of said first, second and third selector gates, respectively, and each has its said input connected to said output of said inverter means to enable these selector gates when there is no signal from the computer to the signal-responsive means connected to said inverter means;

said seventh, eighth and ninth selector gates have their BCD inputs connected to said first BCD outputs of said binary-to-BCD converter means, and have their BCD outputs connected to said BCD inputs of first, second and third selector gates, respectively, to provide said connections between said first, second and third selector gates and said binary-to-BCD converter means;

said tenth selector gate has its BCD inputs connected to said BCD outputs of said binary-to-BCD converter means, has its BCD outputs connected to said first additional BCD latch, and has its enable input connected to said output of said means responsive to another signal from the computer;

said eleventh selector gate has its BCD inputs connected to said BCD outputs of said first BCD switch, has its BCD outputs connected to said first additional BCD latch, and has said enable input connected to said inverter means; and said second additional latch having said least significant digit of its BCD inputs connected to said output of said first and third gate of said decade selector means and having its next significant digit input connected to said outputs of said third and fourth gates of said decade selector means.

27. A multi-counter register system, useful for reading individual accumulated counts in a set of BCD counter means at a local area by local readout means at the local area, which comprises:

sets of gate means, each set having a number of gates corresponding in number to the number of decades of BCD multi-decade counter means to be read, each gate of each set having BCD outputs and having BCD inputs connectable to a different decade of one of the BCD multi-decade counter means, and said sets of gate means being equal in number to the number of sets of BCD counter means to be read;

data display means to provide a visual display of a number of decimal digits corresponding to the total of the number of decades of any of the counter means to be read and the number of digits in the decimal number of counter means of the set to be read;

display decoder means comprising:

a set of display decoders corresponding in number to the number of decades of any of the counter means to be displayed by said data display means, each display decoder having BCD inputs and at least one output connected to said data display means; and additional display decoders corresponding in number to the number of digits in the decimal number of counter means to be read, each additional display decoder having BCD inputs and at least one output connected to said data display means;

data latch means comprising:

a set of latches corresponding in number to the number of said set of display decoders, each latch having BCD outputs connected to said BCD inputs of different display decoders and each latch having BCD inputs connected to all of said BCD outputs of the same decade of said sets of gate means; and additional latches corresponding in number to the number of said additional display decoders, each additional latch having BCD outputs connected to said BCD inputs of different additional display decoders and having BCD inputs; and manually-settable switch means to enable selectively one of said sets of gate means for transfer to said set of latch means the BCD information in that BCD counter means connected to that enabled set of gate means, said manually-settable switch means comprising:

a BCD switch having BCD outputs that provide a specific combination of signals dependent upon the manual setting of said switch to correspond to the decimal digit of the least significant digit of the decimal number assigned to the counter means to be read, said BCD outputs of said BCD switch being connected to said BCD inputs of that one of said additional latches that corresponds to the additional display decoder for the first ten of the counter means; and a BCD-to-decimal decoder with BCD inputs connected to said BCD outputs of said BCD switch and with decimal outputs, each decimal output being connected to an enabling input of a different one of said sets of gate means.

28. The system of claim 27 and further including:

first and second decades and at least a part of a third decade of BCD multi-decade counter means, wherein:

there are first and second decades and at least a part of a third decade of sets of gate means that correspond in number to the number of said counter means;

said additional latches of said data latch means comprises at least first and second additional latches; and said manually-settable switch means further includes:

a second BCD switch having BCD outputs that provide a specific combination of signals dependent upon the manual setting of said second BCD switch to correspond to the decimal digit of the next significant decade of th decimal number assigned to the counter means to be read, said BCD outputs of said second BCD switch being connected to said BCD inputs of said second additional latch;

a first selector gate having BCD outputs, BCD inputs connected to said BCD outputs of said first BCD switch, and an input, when signalled, to enable said first selector gate;

a second selector gate having BCD outputs, BCD inputs connected to said BCD outputs of said first BCD switch and an input, when signalled, to enable said second selector gate;

a third selector gate having BCD outputs, BCD inputs connected to said BCD outputs of said first BCD switch and an input, when signalled, to enable said third selector gate;

said first BCD-to-decimal decoder having its BCD inputs connected to said first BCD switch by being connected to said outputs of said first selector gate, and having each of said decimal outputs connected to an enabling input of a different one of said first decade of said sets of gate means;

a second BCD-to-decimal decoder with BCD inputs connected to said BCD outputs of said second selector gate and with decimal outputs, each decimal output being connected to an enabling input of a different one of said second decade of said sets of gate means;

a third BCD-to-decimal decoder with BCD inputs connected to said BCD outputs of said third selector gate and with decimal outputs, each one of said sets of gates of those that are at least a part of a third decade of sets of gates having an enabling input connected to a different one of said decimal outputs of said thrd decoder; and decade selector means having BCD inputs connected to said BCD outputs of said second BCD switch and having outputs connected to said enable inputs of said first, second and third selector gates, said decade selector means being constructed to enable only said first selector gate when it is provided with no signal from said second BCD switch and to enable instead said second or third selector gate, dependent upon the setting of said second BCD switch to provide a signal for the least significant bit or the next significant bit, respectively, of the BCD signals of the next significant decade of that decimal number provided by the settings of said second BCD switch and said first BCD switch.

29. The system of claim 28 wherein:

said data display means comprises a set of lamps or the like that provide an optical display of decimal digits, some of the lamps providing this optical display of the accumulated count in the BCD counter means being read and two of the lamps providing this optical display of the least and next significant decades of the decimal number assigned to that BCD counter means.

30. A printed circuit boards, useful in a multi-counter register system, comprising:

a set of BCD counter means, each set being a multi-decade counter having BCD outputs for each decade;

a set of gate means corresponding in number to the number of BCD counter means of said set of counter means, each gate means comprising a number of gates corresponding to the number of decades of a different one of said multi-decade counters, each of said number of gates of each set having BCD inputs, having BCD outputs, and having an enable input;

first groups of first sets of four lines, said first groups corresponding in number to the number of BCD counter means of said set of BCD counter means and the lines of each group of said first groups connecting only a different one of said BCD counter means to one of said gate means, each set of four lines of each group corresponding in number to the number of decades of that multi-decade counter means connected by that group to one of said gate means, and the four lines of each set connecting said BCD outputs of one decade only to BCD inputs of a different gate of the same gate means;

second groups of second sets of four lines, said second groups corresponding in number to the number of BCD counter means of said set of BCD counter means and the lines of each group of said second groups being connected to said BCD outputs only of different gate means of said set of gate means, and the four lines of each set of four lines of each group being connected to said BCD outputs of different gates of the same gate means;

third groups of third sets of four lines, each group corresponding in number to the number of gates of that gate means having the highest number of gates, one line of each of said third sets being connected to one line only of each of said second sets of all of said second groups of lines so that the same decade of all of said counters are connected to the same set of four lines, of said third groups of third sets of four lines, through said sets of gate means;

fourth groups of fourth sets of lines, each line of each set connected only to one enable input of the number of gates of one gate means only of said set of gate means; and another set of lines, each line of said another set of lines being connected to a different one of said fourth group of fourth set of lines, said sets of counter means and gate means, all of said groups of said sets of lines, and said another set of lines being circuits and printed lines on a base to constitute at least a part of said board.

* * * * *

UNITED STATES PATENT AND TRADEMARK OFFICE
CERTIFICATE OF CORRECTION

PATENT NO. : 3,967,095
DATED : June 29, 1976
INVENTOR(S) : William M. Herring et al.

It is certified that error appears in the above-identified patent and that said Letters Patent are hereby corrected as shown below:

```
Column 8,  line 42, "corresponding" should read --reading--.
Column 13, line 50, cancel "p".
Column 14, line 7,  "input" should read --input of".
Column 16, line 4,  "3" should read --53--.
Column 18, line 50, "one corresponding" should read --one of--.
Column 20, line 25, "computeroperated" should read
                    --computer-operated--.
           Line 63, "for" should read --from--.
Column 22, line 4,  "latch 136" should read --the--.
Column 24, line 56, "94;" should read --94,--.
Column 30, line 57, cancel "outputs".
Column 31, line 24, "multicounter" should read
                    --multi-counter--.
Column 32, line 13, "signalresponsive" should read
                    --signal-responsive--.
Column 33, line 34, "manuallysettable" should read
                    --manually-settable--.
Column 43, line 49, "th" should read --the--.
Column 44, line 16, "thrd" should read --third--.
           Line 40, "boards" should read --board--.
```

Signed and Sealed this

Twenty-eighth Day of September 1976

[SEAL]

Attest:

RUTH C. MASON
Attesting Officer

C. MARSHALL DANN
Commissioner of Patents and Trademarks